United States Patent
Kim et al.

(10) Patent No.: US 9,142,277 B2
(45) Date of Patent: Sep. 22, 2015

(54) SEMICONDUCTOR MEMORY DEVICE HAVING DISCRIMINARY READ AND WRITE OPERATIONS ACCORDING TO TEMPERATURE

(71) Applicant: SAMSUNG ELECTRONICS CO., LTD.

(72) Inventors: Jinhyun Kim, Yongin-si (KR); Dogeun Kim, Seoul (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/038,720

(22) Filed: Sep. 26, 2013

(65) Prior Publication Data

US 2014/0098600 A1    Apr. 10, 2014

(30) Foreign Application Priority Data

Oct. 9, 2012    (KR) .......................... 10-2012-0111982

(51) Int. Cl.
*G11C 11/16*    (2006.01)
*G11C 7/04*    (2006.01)
*G11C 13/00*    (2006.01)

(52) U.S. Cl.
CPC .............. *G11C 11/1673* (2013.01); *G11C 7/04* (2013.01); *G11C 11/1675* (2013.01); *G11C 11/1695* (2013.01); *G11C 13/004* (2013.01); *G11C 13/0007* (2013.01)

(58) Field of Classification Search
CPC ...................................................... G11C 11/16
USPC .......................................................... 365/158
See application file for complete search history.

(56) References Cited

U.S. PATENT DOCUMENTS

| | | | |
|---|---|---|---|
| 6,608,790 B2 * | 8/2003 | Tran et al. ...................... | 365/212 |
| 7,027,325 B2 | 4/2006 | Iwata | |
| 7,511,990 B2 * | 3/2009 | Chung et al. ................... | 365/158 |
| 7,755,965 B2 * | 7/2010 | Chen et al. ...................... | 365/211 |
| 7,920,417 B2 | 4/2011 | Seo et al. | |
| 2010/0284215 A1 | 11/2010 | Prejbeanu et al. | |
| 2011/0280062 A1 | 11/2011 | Oh et al. | |
| 2011/0310679 A1 | 12/2011 | Carey et al. | |
| 2011/0316606 A1 | 12/2011 | Ladurner et al. | |
| 2012/0008380 A1 | 1/2012 | El Baraji et al. | |
| 2012/0084526 A1 | 4/2012 | Ise et al. | |
| 2014/0119107 A1 * | 5/2014 | Cha ................................ | 365/158 |

FOREIGN PATENT DOCUMENTS

| | | |
|---|---|---|
| JP | 2008-177594 | 7/2008 |
| JP | 2010-092521 | 4/2010 |

\* cited by examiner

*Primary Examiner* — Son Mai
(74) *Attorney, Agent, or Firm* — Muir Patent Law, PLLC

(57) ABSTRACT

A semiconductor memory device is provided which includes a memory cell array including magnetic memory cells arranged in a matrix form of rows and columns and connected with bit lines and a source line; and a temperature sensing unit configured to generate a temperature sensing signal by sensing a temperature of the memory cell array. A memory controller, constituting a memory system together with the semiconductor memory device, may control read and write operations of the semiconductor memory device differently according to the temperature sensing signal of the temperature sensing unit.

20 Claims, 17 Drawing Sheets

SEMICONDUCTOR MEMORY DEVICE HAVING DISCRIMINARY READ AND WRITE OPERATIONS ACCORDING TO TEMPERATURE

CROSS-REFERENCE TO RELATED APPLICATIONS

This U.S. non-provisional application claims priority under 35 U.S.C. §119 to Korean Patent Application No. 10-2012-0111982 filed Oct. 9, 2012, in the Korean Intellectual Property Office, the disclosure of which is incorporated by reference herein in its entirety.

TECHNICAL FIELD

The inventive concepts described herein relate to a semiconductor memory device.

A volatile semiconductor memory device such as a random access memory (hereinafter, referred to as DRAM) is often used as a main memory of an electronic device (e.g., mobile device or computer).

A memory system including the volatile semiconductor memory device and a memory control device may be embedded in or connected with a host device, such as a microprocessor.

A nonvolatile memory device, such as a magnetic random access memory (hereinafter, referred to as an MRAM) may overcome certain drawbacks of the DRAM. MRAM is nonvolatile, and possesses high-integration, high-speed, and low-power characteristics.

In general, a magnetic memory cell in the MRAM may comprise an access transistor to perform a switching operation and a magnetic tunnel junction (MTJ) element to store data. As a type of magnetic memory element, the MTJ element may have magneto resistance (MR) varied according to magnetization directions of two ferromagnetic substances. In the MRAM, data stored at the MTJ element may be interpreted as a '1' or '0' by sensing a variation in the magneto resistance.

A memory cell in the MRAM may be sensitive to a temperature due to a characteristic of the MTJ element.

SUMMARY

Embodiments disclosed herein include a semiconductor memory system which may comprise a semiconductor memory device including a memory cell array of magnetic memory cells arranged in a matrix form of rows and columns and connected with bit lines and a source line and a temperature sensing unit configured to generate a temperature sensing signal by sensing a temperature of the memory cell array; and a memory controller configured to control write operations and read operations of the semiconductor memory device differently according to the temperature sensing signal of the temperature sensing unit.

In example embodiments, when the temperature sensing signal indicates a temperature higher than a reference temperature, the number of write operations is controlled to be more than the number of read operations.

In example embodiments, an operating frequency of the write operations is controlled to be higher than an operating frequency of the read operations.

In example embodiments, the number of commands for the write operations is controlled to be more than the number of commands for the read operations.

In example embodiments, when the temperature sensing signal indicates a temperature lower than a reference temperature, the number of read operations is controlled to be more than the number of write operations.

In example embodiments, an operating frequency of the read operations is controlled to be higher than an operating frequency of the write operations.

In example embodiments, the number of commands for the read operations is controlled to be more than the number of commands for the write operations.

In example embodiments, the memory controller has a separate input terminal for receiving the temperature sensing signal.

In example embodiments, each memory cell is a spin transfer torque magneto-resistive random access memory (STT-MRAM) cell.

Another aspect of embodiments of the inventive concept is directed to provide a semiconductor memory device which may comprise a memory cell array including magnetic memory cells arranged in a matrix form of rows and columns and connected with bit lines and a source line; a temperature sensing unit configured to generate a temperature sensing signal by sensing a temperature of the memory cell array; and a control circuit configured to control the memory cell array differently for write operations and read operations according to the temperature sensing signal of the temperature sensing unit.

In example embodiments, when the temperature sensing signal indicates a temperature higher than a reference temperature, the number of write operations is controlled to be more than the number of read operations.

In example embodiments, an operating frequency of the write operations is controlled to be higher than an operating frequency of the read operations.

In example embodiments, when the temperature sensing signal indicates a temperature lower than a reference temperature, the number of read operations is controlled to be more than the number of write operations.

In example embodiments, an operating frequency of the read operations is controlled to be higher than an operating frequency of the write operations.

In example embodiments, the semiconductor memory device further comprises an input/output circuit configured to transfer the temperature sensing signal to a memory controller.

Still another aspect of embodiments of the inventive concept is directed to provide a semiconductor memory device which comprises a memory cell array including magnetic memory cells arranged in a matrix form of rows and columns and connected with bit lines and a source line; a temperature sensing unit configured to generate a temperature sensing signal by sensing a temperature of the memory cell array; an operating voltage generating unit configured to generate first and second write voltages having different levels and first and second read voltages having different levels according to the temperature sensing signal of the temperature sensing unit at each mode of operation; and a control circuit including a blocking unit configured to a write command or a read command according to the temperature sensing signal, the control circuit being configured to control an access amount of the memory cells according to the temperature sensing signal.

In example embodiments, when the temperature sensing signal indicates a temperature higher than a reference temperature, the first write voltage lower than the second write voltage is generated.

In example embodiments, when the temperature sensing signal indicates a temperature higher than a reference temperature, the first read voltage lower than the second read voltage is generated.

Still another aspect of embodiments of the inventive concept is directed to provide an operation controlling method of a semiconductor memory device comprising generating a temperature sensing signal by sensing a temperature of at least a portion of the semiconductor memory device; controlling the number of write operations to be more than the number of read operations when the temperature sensing signal is at a first state; and controlling the number of read operations to be more than the number of write operations when the temperature sensing signal is at a second state.

In example embodiments, the number of read operations is controlled to be below a predetermined maximum number at the first state, and the number of write operations is controlled to be below a predetermined maximum number at the second state.

Still another aspect of embodiments of the inventive concept is directed to a memory controller configured to control read and write operations for a memory device in response to a temperature sensing signal received from the memory device. The memory controller may adjust a ratio of read commands to write commands issued to the memory device according to the temperature sensing signal. The memory controller may adjust a frequency of read commands and/or write commands according to the temperature sensing signal.

Other aspects contemplate methods reflecting operations of the devices and/or systems described herein.

With embodiments of the inventive concept, the read and write operations of the semiconductor memory device may be discriminated according to a temperature, so that read disturbance is minimized or prevented.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
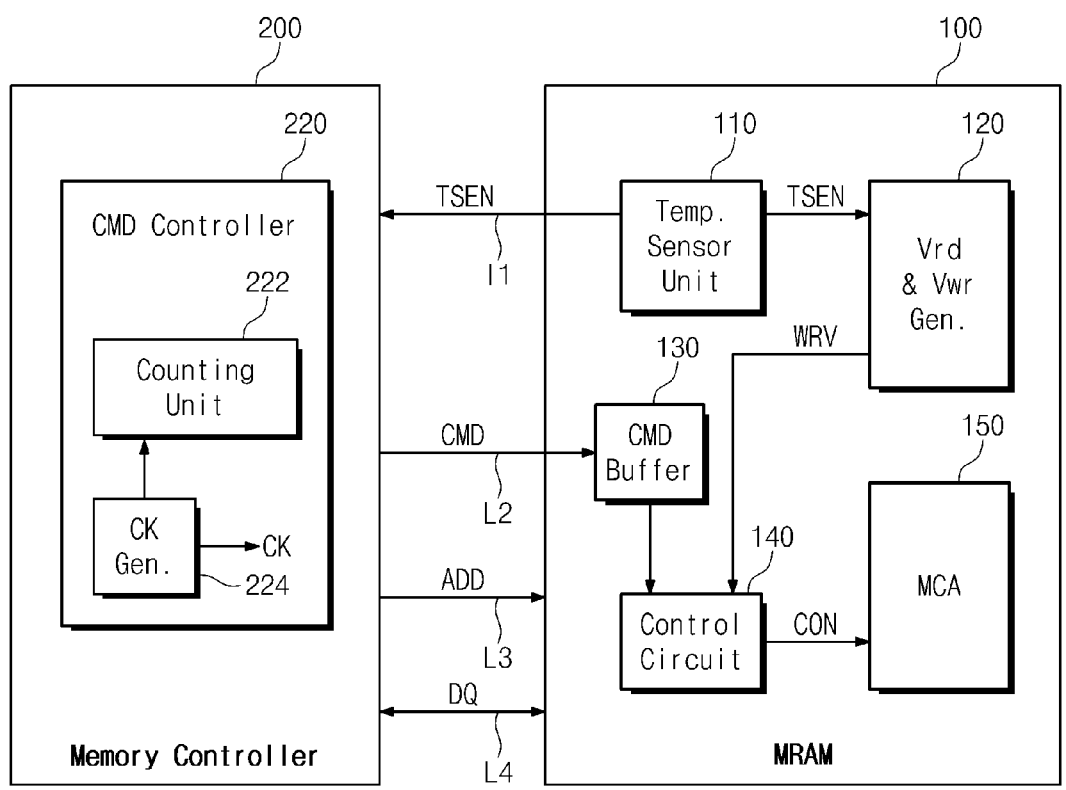
FIG. 1 is a block diagram schematically illustrating a semiconductor memory system according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Embodiments disclosed therein may include their complementary embodiments. Note that details of data access operations and internal function circuits associated with a DRAM and an MRAM may be skipped to prevent the inventive concept from becoming ambiguous.

FIG. 1 is a block diagram schematically illustrating a semiconductor memory system according to an embodiment of the inventive concept.

Referring to FIG. 1, a semiconductor memory system may include a semiconductor memory device 100 and a memory controller 200.

The semiconductor memory device 100 and the memory controller 200 may be connected through a temperature sensing signal transfer line L1, a command transfer line L2, an address transfer line L3, and a data communication line L4.

The semiconductor memory device 100 may include a memory cell array 150 which has memory cells arranged in a matrix of rows and columns and storing data having a polarity corresponding to a direction of current flowing between a bit line and a source line.

The semiconductor memory device 100 may further comprise a temperature sensor unit 110 which senses a temperature of the memory cell array 150 to generate a temperature sensing signal TSEN.

The semiconductor memory device 100 may further comprise a read and write voltage generator 120, a command buffer 130, and a control circuit 140.

The read and write voltage generator 120 may generate a read voltage at a read operation and a write voltage WRV at a write operation.

The command buffer 130 may buffer a command received through the command transfer line L2.

The control circuit 140 may decode a command from the command buffer 130 to control a read operation or a write operation. At a write operation, the control circuit 140 may receive the write voltage WRV from the read and write voltage generator 120 to write data at a selected memory cell of the memory cell array 150. At a read operation, the control circuit 140 may receive the read voltage from the read and write voltage generator 120 to read data stored at a selected memory cell of the memory cell array 150.

The memory controller 200 may include a command controller 220. The command controller 220 may include a counting unit 222 and a clock generator 224.

The clock generator 224 may generate a clock used for read and write operations of the semiconductor memory device 100.

At a temperature control mode of operation where an operation of a memory cell is controlled according to a temperature, the counting unit 222 may count the event that a command is output through the command transfer line L2.

The memory controller 200 may control the read and write operations of the semiconductor memory device 100 differently according to the temperature sensing signal TSEN provided from the temperature sensing unit 110 of the semiconductor memory device 100.

In a case where the semiconductor memory device 100 is an MRAM, a magnetic memory cell of the memory cell array 150 may be formed of an access transistor and an MTJ element.

The MTJ may be sensitive to a variation in temperature. The temperature sensing unit 110 may sense a temperature of a memory cell or the memory cell array 150. The temperature sensing unit 110 may generate a temperature sensing signal according to the sensed temperature. For example, the temperature sensing unit 110 may generate information indicating a hot temperature and a cold temperature on the basis of a specific temperature. For example, if a current temperature is a relatively hot temperature, the temperature sensing unit 110 may output '1'. If a current temperature is a relatively cold temperature, the temperature sensing unit 110 may output '0'. However, the inventive concept is not limited thereto. For example, in the event that a temperature region is divided into a plurality of zones, a digital temperature sensing signal having a plurality of bits may be generated.

For ease of description, it is assumed that a temperature region is divided into two temperature zones, that is, a hot temperature zone and a cold temperature zone and '1' and '0' are generated at the hot temperature zone and the cold temperature zone, respectively.

The temperature sensing unit 110 may output the temperature sensing signal having '1' at a hot temperature. Herein, '1' may mean a digital logic level 'H'.

When the temperature sensing signal indicates a hot temperature, the read and write voltage generator 120 may generate the read and write voltages to be suitable for a high-temperature characteristic of a memory cell. When the temperature sensing signal indicates a cold temperature, the read and write voltage generator 120 may generate the read and write voltages to be suitable for a low-temperature characteristic of a memory cell.

The amount of write current of the MTJ at a hot temperature may be less than that at a cold temperature. In this case, the write voltage generated at the hot temperature may be lower than the write voltage generated at the cold temperature. Also, to secure read margin, the read voltage generated at the hot temperature may be lower than the read voltage generated at the cold temperature.

The read margin may be reduced by reducing the write current at the hot temperature. This may cause read disturbance at a read operation.

To solve the read disturbance issue generated by insufficient read margin at the hot temperature, at the hot temperature, the number of write operations may be controlled to be more than the number of read operations. For example, a write operation frequency may be set to be higher than a read operation frequency. Alternatively, the frequency of write commands may be set to be higher than the frequency of read commands.

Further, it is desirable to reduce the number of read operations at a hot temperature. For this reason, to manage the number of read commands below an allowable maximum issue number, it may be necessary to address the read disturbance issue. For example, if the allowable maximum issue number is N (N being an integer more than 3), the number of read commands to be generated may be managed to be lower than N.

The temperature sensing unit 110 may output the temperature sensing signal having '0' at a cold temperature. Herein, '0' may mean a digital logic level 'L'.

The amount of write current at the cold temperature may be more than that at the hot temperature. In this case, the write voltage generated at the cold temperature may be set to be higher than that generated at the hot temperature.

As the write current increases at the cold temperature, the read margin may be secured sufficiently. In this case, the probability that the read disturbance is generated at the read operation may be remarkably reduced.

In example embodiments, at the cold temperature, the number of read operations may be controlled to be more than the number of write operations in view of the fact that the read disturbance issue is reduced at the cold temperature. For this, a read operation frequency may be set to be higher than a write operation frequency. Alternatively, the frequency of read commands may be set to be higher than the frequency of write commands.

Further, it is desirable to reduce the number of write operations at the cold temperature. In this case, the number of write commands may be set below an allowable maximum issue number. Thus, if the allowable maximum issue number is N (N being an integer more than 3), the number of write commands to be generated may be managed to be lower than N.

In FIG. 1, the memory controller 200 may receive the temperature sensing signal TSEN provided from the temperature sensing unit 110 of the semiconductor memory device 100 through the temperature sensing signal transfer line L1. In the memory controller 200, the command controller 220 may control the number of write commands to be generated at the hot temperature so as to be more than the number of read commands to be generated. In this case, a write operation may be performed more frequently in comparison with a read operation, so that the above-described read disturbance problem is addressed.

To limit the numbers of read operations to be executed below an allowable maximum value at the hot temperature, the command controller 200 may refer to a counting value, indicating the number of read commands generated, from the counting unit 222.

The command controller 220 of the memory controller 200 may control the number of read command to be generated at the cold temperature so as to be more than the number of write command to be generated. In this case, at the cold temperature, the read operation may be performed more frequently in comparison with the write operation.

To limit the numbers of write operations to be executed below an allowable maximum value at the cold temperature, the command controller 200 may refer to a counting value, indicating the number of write commands generated, from the counting unit 222.

As described above, the write and read operations of the semiconductor memory device 100 may be controlled differently according to a temperature under a control of the memory controller 200.

The memory controller 200 may be a CPU or an MPU, and may have such a function that the read and write operations are delayed or adjusted to be within allowed operation circumstances. At execution of any task, the memory controller 200 may check a state of the temperature sensing signal TSEN to decide whether to control a write operation or whether to control a read operation, e.g., through delay of the write operation.

As described above, there is described an example in which the frequency of read commands and the frequency of write commands are controlled. However, the inventive concept is not limited thereto.

For example, a period (or, frequency) where a command or operation is applied may vary, such as by a multiple of n, where n is an integer. For example, at the hot temperature, a write command may be applied in a double date rate (DDR), and a read command may be applied in a single data rate (SDR). Alternatively, a read command may be applied in the double date rate (DDR), and a write command may be applied in the single data rate (SDR).

Figure 2:
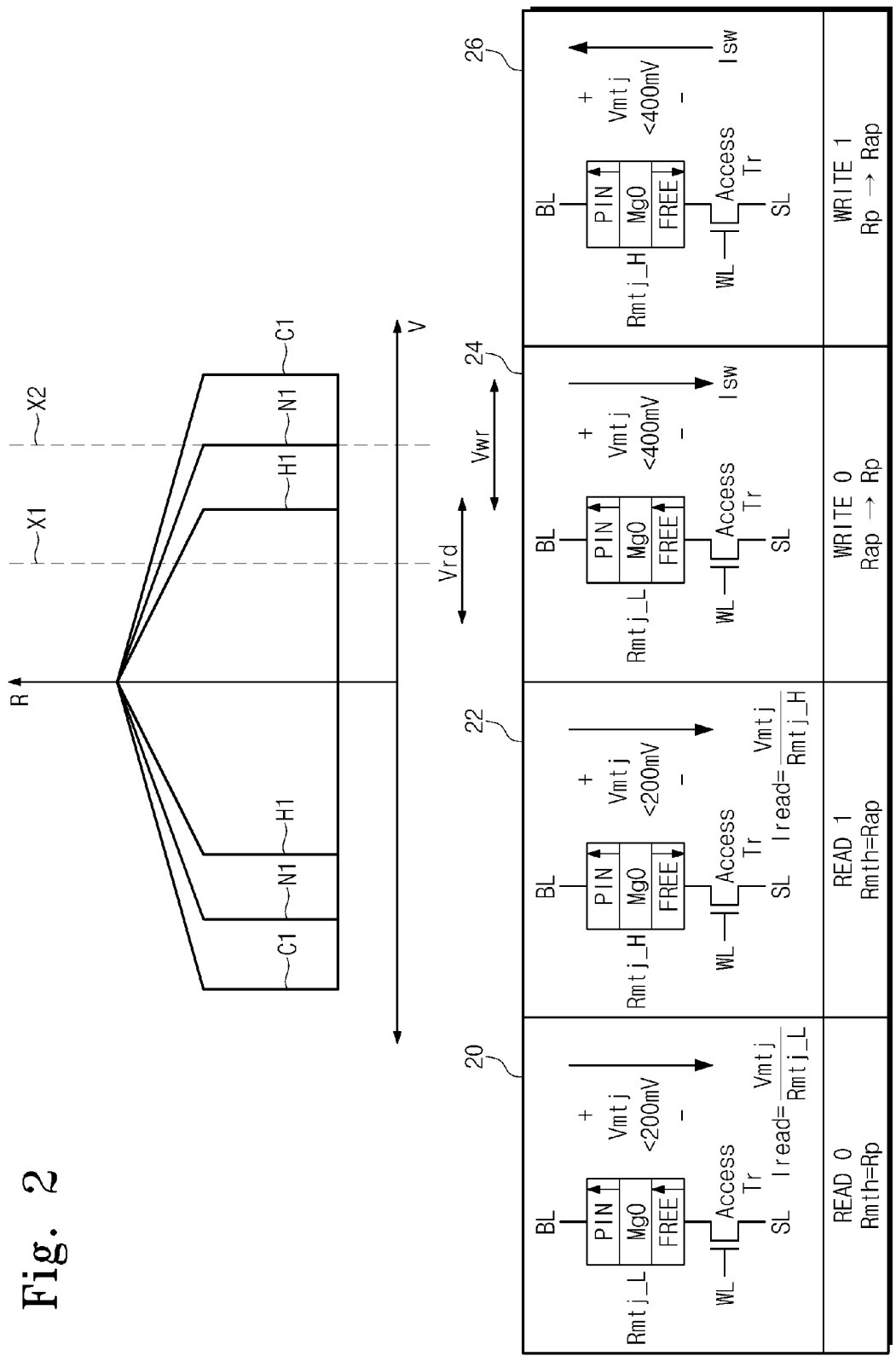
FIG. 2 is a diagram illustrating an operating characteristic of a memory cell applied to FIG. 1.

FIG. 2 is a diagram illustrating an operating characteristic of a memory cell applied to FIG. 1.

Referring to FIG. 2, there is illustrated an operating characteristic of an MTJ of a memory cell. In FIG. 2, a horizontal axis indicates a voltage V, and a vertical axis indicates a resistance value R.

Characteristic curve N1 indicates a voltage to resistance characteristic of the MTJ according to a reference temperature. Characteristic curve C1 indicates a voltage to resistance characteristic of the MTJ at a cold temperature. Characteristic curve H1 may indicate a voltage to resistance characteristic of the MTJ at a hot temperature.

In case of the characteristic curve N1, a write margin Vwr may exist about a second dotted-line vertical axis X2. In case of characteristic curve N1, a read margin Vrd may exist about a first dotted-line vertical axis X1.

In the MTJ, if a temperature changes to a high-temperature state from a reference temperature, the characteristic curve of the MTJ may vary from N1 to H1. In this case, the characteristic curve H1 may exist within the read margin Vrd. Thus, the read disturbance may be caused by an insufficient read margin. For example, if the read voltage Vrd is greater than a voltage Va, the read voltage Vrd may unintentionally cause a change in the resistance (and logic state) of the MTJ.

In the MTJ, if a temperature changes to a low-temperature state from the reference temperature, the characteristic curve of the MTJ may vary from N1 to C1. The characteristic curve C1 may exist under a condition that it is spaced apart from the read margin Vrd. Thus, a sufficient read margin may be secured.

In FIG. 2, reference numeral '20' illustrates a read operation principle when data '0' is read from the MTJ. In the MJT cell of 20, the magnetization directions of the two ferromagnetic layers PIN and FREE are the same. The MJT cell resistance is thus Rp.

In FIG. 2, reference numeral '22' illustrates a read operation principle when data '1' is read from the MTJ. In comparison with the reference numeral '20', since magnetization directions of two ferromagnetic layers PIN and FREE of the MTJ cell are opposite to each other, magnetoresistance MR of the MTJ cell is Rap, different from Rp of the MTJ cell of 20. The different resistances thus provide a distinctive characteristic to represent a '0' or '1' when the MTJ cell is read.

In FIG. 2, a reference numeral '24' illustrates a write operation principle when data '0' is written at the MTJ. A write current ISW having a negative value of sufficient magnitude acts to assure the direction of the ferromagnetic layer FREE is aligned in the same direction of the ferromagnetic layer PIN and to change the magnetoresistance MR of the MTJ cell from Rap to Rp.

In FIG. 2, a reference numeral '26' illustrates a write operation principle when data '1' is written at the MTJ. A write current ISW having a positive value of sufficient magnitude acts to assure the direction of the ferromagnetic layer FREE is aligned in the opposite direction of the ferromagnetic layer PIN and to change the magnetoresistance MR of the MTJ cell from Rp to Rap.

To address the above-described read disturbance issue according to a temperature-dependent characteristic of the MTJ, a semiconductor memory system of FIG. 1 may be controlled such that write and read operations are responsive to a temperature.

Figure 3:
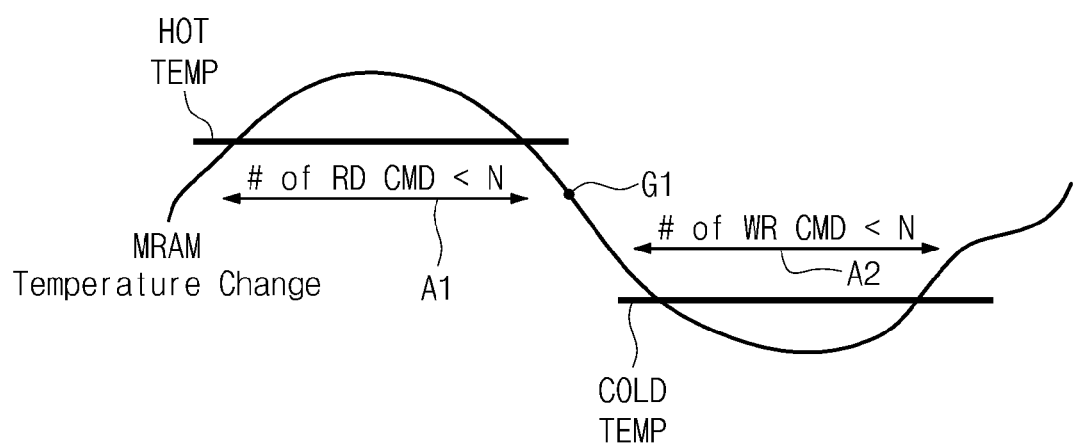
FIG. 3 is a diagram illustrating a driving principle according a variation in a temperature of a memory cell of FIG. 2.

FIG. 3 is a diagram illustrating a driving principle according a variation in a temperature of a memory cell of FIG. 2.

Referring to FIG. 3, a graph G1 may indicate a variation in a temperature of an MRAM over time. At a hot temperature, the number of write operations may be controlled to be relatively larger than the read operations. Since it is desirable to reduce the number of read operations at the hot temperature, the number of read commands may be controlled to be below an allowable maximum issue number. As shown by a reference symbol A1, if the allowable maximum issue number is N (N being an integer more than 3), the number of generated read commands may be controlled to be less than N.

At a cold temperature, the number of read operations may be controlled to be relatively larger than a number of write operations. Since it is desirable to reduce the number of write operations at the cold temperature, the number of write commands may be controlled to be below an allowable maximum issue number. As shown by a reference symbol A2, if the allowable maximum issue number is N (N being an integer more than 3), the number of generated write commands may be controlled to be less than N.

Figure 4:
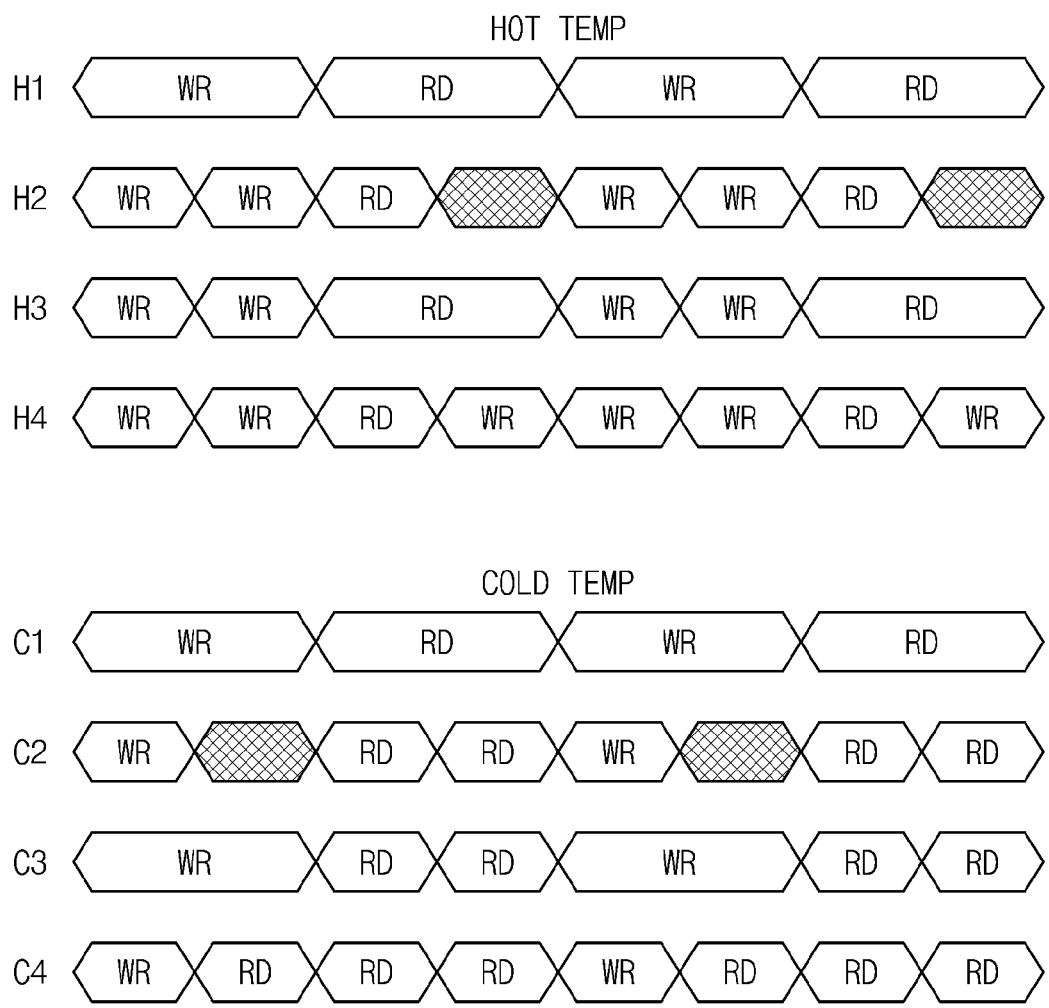
FIG. 4 is a timing diagram illustrating a read operation and a write operation of a memory cell dependent on a temperature.

FIG. 4 is a timing diagram illustrating a read operation and a write operation of a memory cell dependent on a temperature.

Referring to FIG. 4, at a hot temperature, a read and write operating waveform H1 may be changed into one of read and write operating waveforms H2, H3 and H4. For example, referring to the read and write operating waveform H2, a write operation may be performed two times within a write period of the read and write operating waveform H1. In case of the read and write operating waveform H2, a don't care period may exist within a read period of the read and write operating waveform H1.

Referring to the read and write operating waveform H3, a write operation may be performed two times within a write period of the read and write operating waveform H1, and a frequency of a read operation may be equal to that of the read and write operating waveform H1. In this case, the read and write operating waveform H3 may not include a don't care period.

Referring to the read and write operating waveform H4, a write operation may be performed two times within a write period of the read and write operating waveform H1. A length of a read operation may be equal to that of a write operation, and a read operation and a write operation may be performed within each read period of the read and write operating waveform H1. As compared to read and write operating waveforms H1, H2 and H3, more write operations are performed during the read and write operating waveform H4.

Thus, at the hot temperature, write operations may be controlled to be performed more frequently than read operations.

The read and write operating waveforms H1 to H4 may indicate cycles of read and write operations of a semiconductor memory device 100. However, the read and write operating waveforms H1 to H4 may be cycles of read and write commands applied from a memory controller.

At a cold temperature, a read and write operating waveform C1 may be changed into one of read and write operating waveforms C2, C3 and C4. For example, referring to the read and write operating waveform C2, a read operation may be performed two times within a read period of the read and write operating waveform C1. In case of the read and write operating waveform C2, a don't care period may exist within a write period of the read and write operating waveform C1.

Referring to the read and write operating waveform C3, a read operation may be performed two times within a read period of the read and write operating waveform C1. A frequency of a write operation may be equal to that of the read and write operating waveform C1. In this case, the read and write operating waveform C3 may not include a don't care period.

Referring to the read and write operating waveform C4, a read operation may be performed two times within a read period of the read and write operating waveform C1. A length of a write operation may be equal to that of a read operation, and a read operation and a write operation may be performed within each write period of the read and write operating waveform C1. As compared to read and write operating waveforms H1, H2 and H3, more read operations are performed during the read and write operating waveform C4.

Thus, at the cold temperature, a read operation may be controlled to be performed more frequently than a write operation.

The read and write operating waveforms C1 to C4 may indicate cycles of read and write operations of the semiconductor memory device 100. However, the read and write operating waveforms C1 to C4 may be cycles of read and write commands applied from a memory controller.

Figure 5:
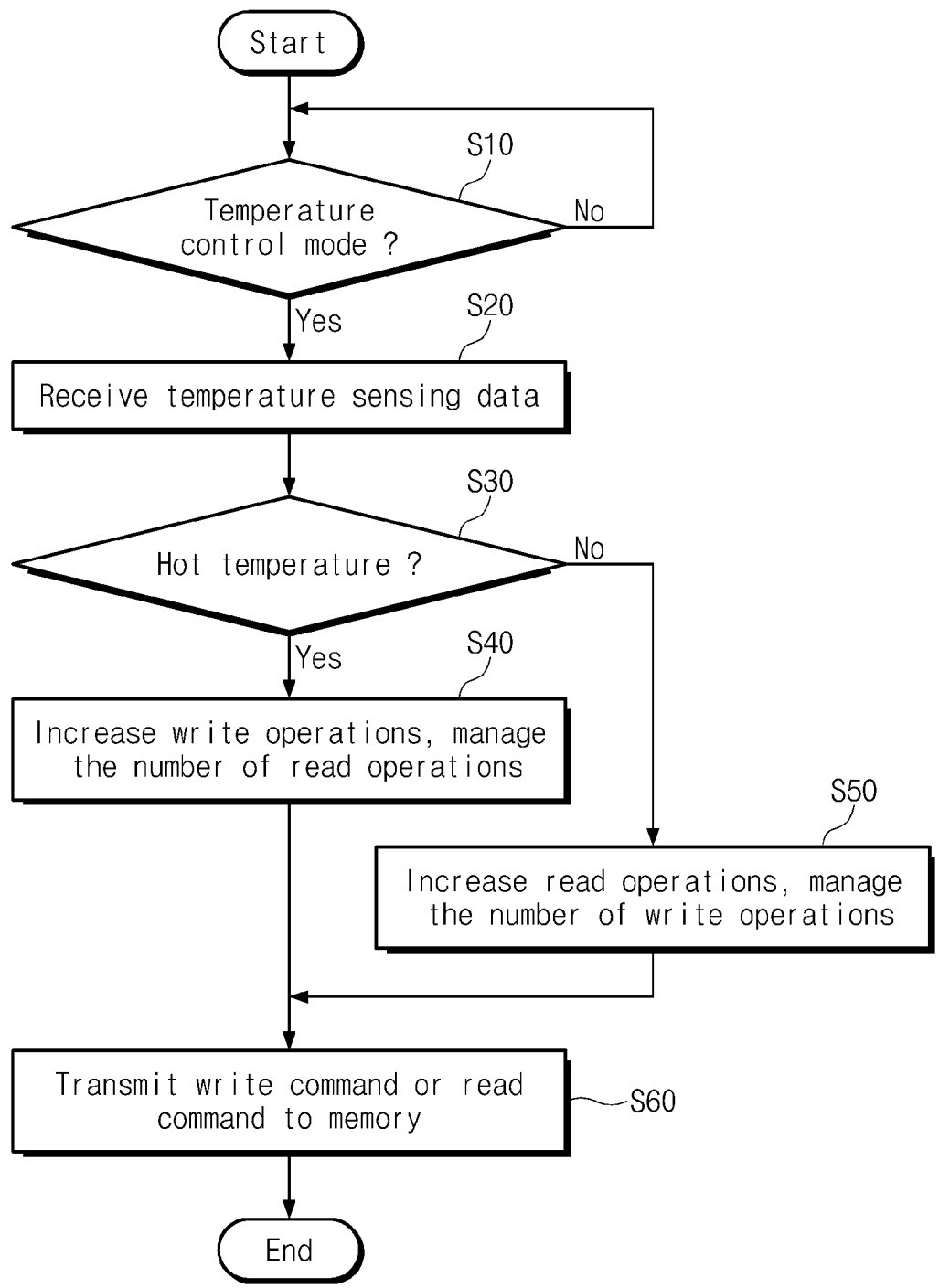
FIG. 5 is an operating control flow chart of a semiconductor memory device discriminated according to a temperature.

FIG. 5 is an operating control flow chart of a semiconductor memory device whose operation is dependent on temperature.

The operation of FIG. 5 may be controlled by a memory controller 200 or a command controller 220.

In operation S10, the memory controller 200 determines whether a temperature control mode is executed. That is, it is checked whether to execute the temperature control mode in which the number of write operations increases relatively at a hot temperature and the number of read operations increases relatively at a cold temperature. In the case that the temperature control mode is set through programming or fuse programming of the memory controller 200 or through a separate execution signal applied from an external device, the memory controller 200 may perform the temperature control mode by checking the setting result.

In the event that the temperature control mode is executed, in operation S20, temperature sensing data may be received. The temperature sensing data may be generated from a temperature sensing unit 110 of FIG. 1.

In operation S30, whether a temperature is a hot temperature may be determined. In this example, if the temperature sensing data '1' is received, a temperature may be determined to be a hot temperature. At this time, the method proceeds to operation S40. If the temperature sensing data '0' is received, a temperature may be determined to be a cold temperature. At this time, the method proceeds to operation S50.

In operation S40, an increase in the number of write operations may be decided. Also, the memory controller 200 may manage the number of read operations. That is, a counting value indicating the number of read operations may be compared with a value indicating an allowable maximum read operation number to limit the number of read operations.

In operation S50, an increase in the number of read operations may be decided. Also, the memory controller 200 may manage the number of write operations. That is, a counting value indicating the number of write operations may be compared with a value indicating an allowable maximum write operation number to limit the number of write operations.

In operation S60, a write command or a read command decided according to the hot temperature and the cold temperature may be transmitted to the semiconductor memory device 100.

Thus, a write operation may be performed frequently at the hot temperature, and a read operation may be performed frequently at the cold temperature. As the read disturbance is prevented or minimized at the hot temperature, the reliability of a semiconductor memory system may be bettered.

Figure 6:
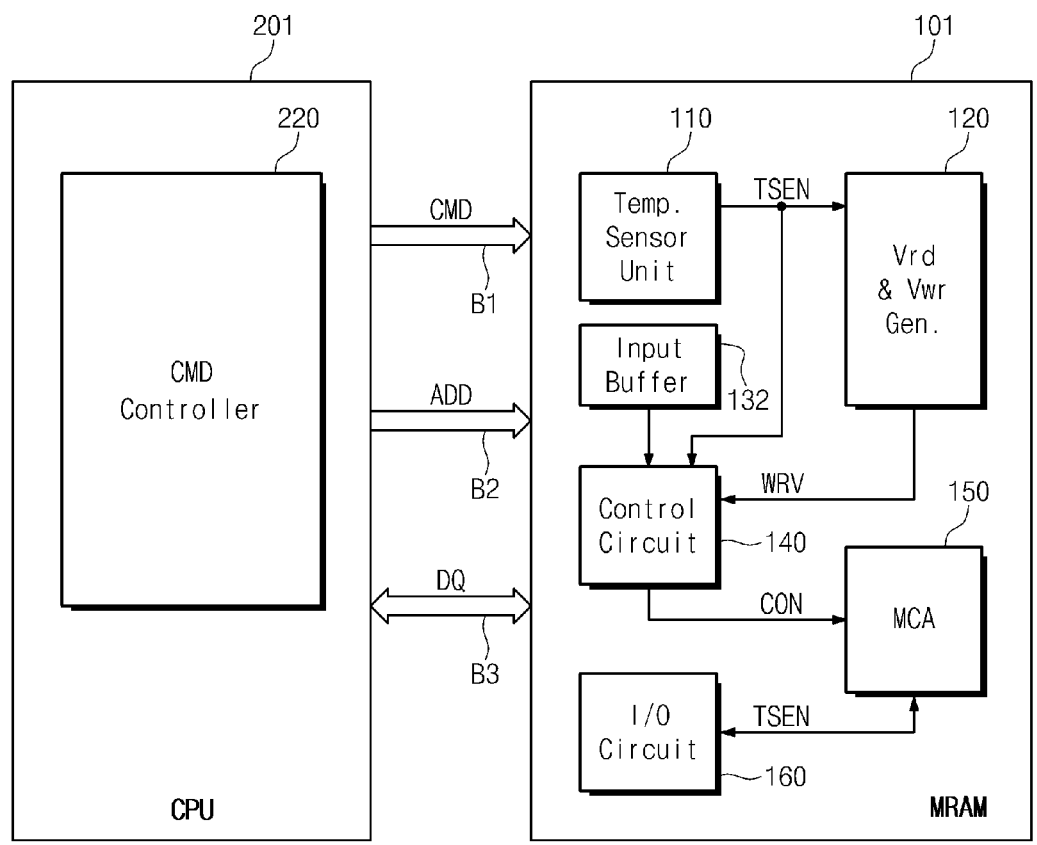
FIG. 6 is a block diagram schematically illustrating a semiconductor memory system according to another embodiment of the inventive concept.

FIG. 6 is a block diagram schematically illustrating a semiconductor memory system according to another embodiment of the inventive concept.

Referring to FIG. 6, a semiconductor memory system may include a semiconductor memory device 101 and a memory controller 201.

The semiconductor memory device 101 and the memory controller 201 may be connected through a command bus B1, an address bus B2, and a data bus B3.

Unlike FIG. 1 where a temperature sensing signal TSEN is transferred through a transfer line L1, the semiconductor memory device 101 of FIG. 6 may transfer a temperature sensing signal through a bus, such as the data bus B3.

Like FIG. 1, the semiconductor memory device 101 may include a memory cell array 150 which has memory cells arranged in a matrix of rows and columns and storing data having a polarity corresponding to a direction of current flowing between a bit line and a source line.

The semiconductor memory device 101 may further comprise a temperature sensor unit 110 which senses a temperature of the memory cell array 150 to generate a temperature sensing signal TSEN.

The semiconductor memory device 101 may further comprise a read and write voltage generator 120, an input buffer 132, an input/output circuit 160, and a control circuit 140.

The read and write voltage generator 120 may generate a read voltage at a read operation and a write voltage WRV at a write operation.

The input buffer 132 may buffer a command applied through the command bus B1 and an address applied through the address bus B2.

The control circuit 140 may decode a command and an address from the input buffer 132 to control a read operation or a write operation. At a write operation, the control circuit 140 may receive the write voltage WRV from the read and write voltage generator 120 to write data at a selected memory cell of the memory cell array 150. At a read operation, the control circuit 140 may receive the read voltage from the read and write voltage generator 120 to read data stored at a selected memory cell of the memory cell array 150.

The input/output circuit 160 may receive write data and output data read from a memory cell. The input/output circuit 160 may output the temperature sensing signal TSEN to the data bus B3 when a temperature control mode of operation is executed.

The memory controller 201 may include a command controller 220. The command controller 220 may include a counting unit 222 and a clock generator 224 as described with reference to FIG. 1.

The clock generator 224 may generate a clock used for read and write operations of the semiconductor memory device 101.

At a temperature control mode of operation where an operation of a memory cell is controlled according to a temperature, the counting unit 222 may count the event that a write command or a read command is output through the command bus B1.

The memory controller 201 may receive the temperature sensing signal TSEN output from the input/output circuit 160 of the semiconductor memory device 101. The memory controller 201 may control the read and write operations of the semiconductor memory device 100 differently according to the temperature sensing signal TSEN.

In a case where the semiconductor memory device 101 is an MRAM, a magnetic memory cell of the memory cell array 150 may be formed of an access transistor and an MTJ element.

In FIG. 6, when the temperature control mode of operation is executed, the memory controller 201 may provide the semiconductor memory device 101 with a specific command requiring a transfer of the temperature sensing signal TSEN. However, the inventive concept is not limited thereto. For example, the semiconductor memory device 101 may output the temperature sensing signal TSEN through the input/output circuit 160 periodically. The control circuit 140 of the semiconductor memory device 101 may output the temperature sensing signal TSEN in an interrupt manner when the temperature transitions to a cold temperature state from a hot temperature state or the temperature transitions to a hot temperature state from a cold temperature state.

With the semiconductor memory system of FIG. 6, since the temperature sensing signal TSEN is transmitted through the data bus B3, the temperature sensing signal transfer line L1 of FIG. 1 may be unnecessary. Thus, the semiconductor memory system may not have a separate line for transferring the temperature sensing signal.

Figure 7:
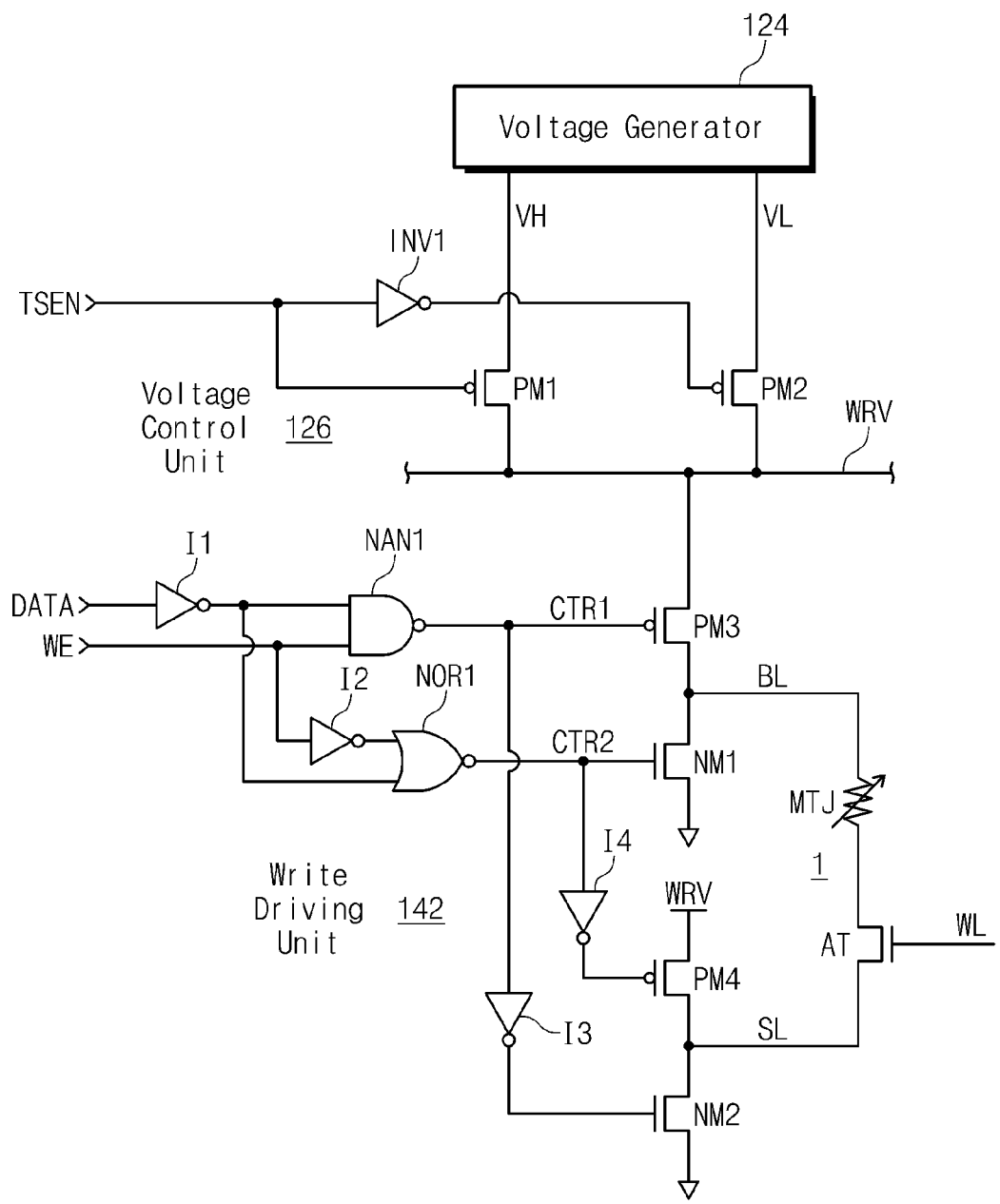
FIG. 7 is a circuit diagram illustrating a cell driving circuit according to an embodiment of the inventive concept.

FIG. 7 is a circuit diagram illustrating a cell driving circuit according to an embodiment.

The cell driving circuit of FIG. 7 comprises a voltage control unit 126 and a write driving unit 142.

The voltage control unit 126 may correspond to a part of a read and write voltage generator 120 of FIGS. 1 and 6, and the write driving unit 142 may be included in a control circuit 140 of FIGS. 1 and 6.

The voltage control unit 126 may include a voltage generator 124, an inverter INV1, and PMOS transistors PM1 and PM2.

The write driving unit 142 may include inverters I1, I2, I3, and I4, a NAND gate NAN1, a NOR gate NOR1, PMOS transistors PM3 and PM4, and NMOS transistors NM1 and NM2.

In the event that a temperature of the memory device, such as the temperature of memory cell 1 formed of an MTJ and an access transistor AT, is higher than a reference temperature, a temperature sensing unit 110 may generate a temperature sensing signal TSEN of logic '1'. That is, at a hot temperature, a logic state of the temperature sensing signal TSEN may be 'H'. However, the inventive concept is not limited thereto.

At the hot temperature, the temperature sensing signal TSEN having a '1' state may be applied to the voltage control unit 126. Since the inversion of the temperature sensing signal TSEN having a '1' state is applied to a gate of the PMOS transistor PM2 of the voltage control unit 126 (via the inverter INV1), the PMOS transistor PM2 is turned on. Meanwhile, since the temperature sensing signal TSEN having a '1' state is applied to a gate of the PMOS transistor PM1 of the voltage control unit 126, the PMOS transistor PM1 is turned off.

Thus, at the hot temperature, a write voltage having a low write voltage VL may be generated. A level of the low write voltage VL may be lower than that of a high write voltage VH as illustrated in FIG. 8.

Figure 8:
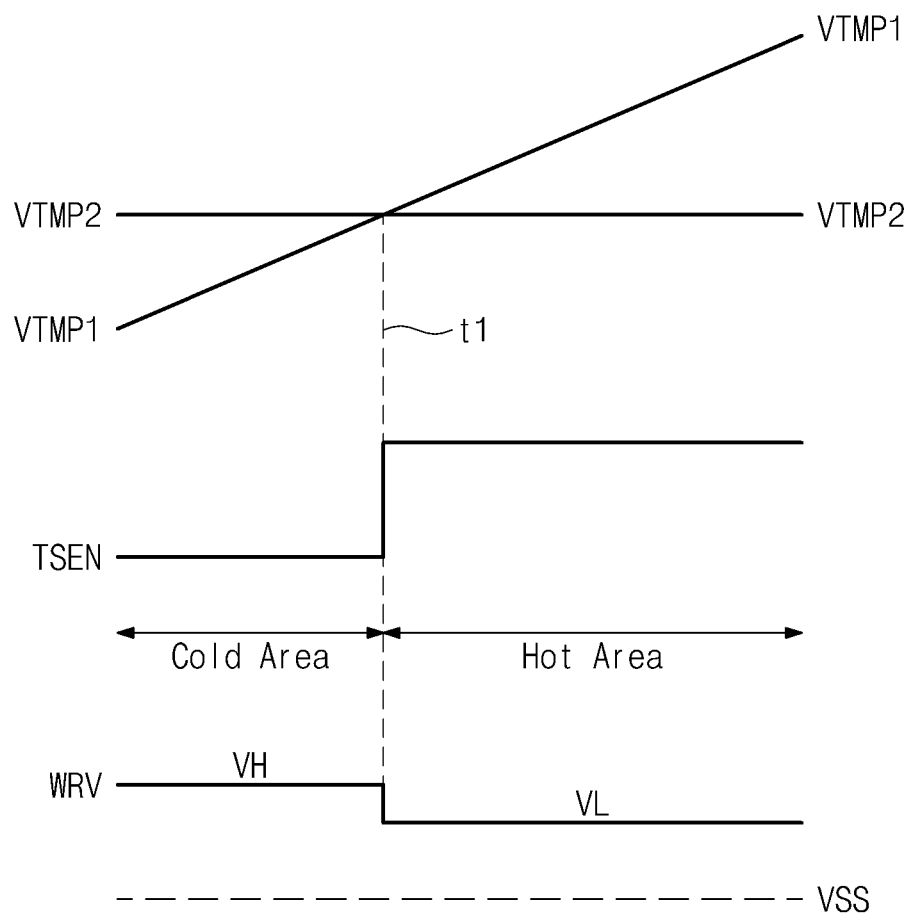
FIG. 8 is a timing diagram illustrating signals associated with FIG. 8.

FIG. 8 is a timing diagram illustrating signals associated with FIG. 8. In FIG. 8, "VTMP1" may indicate a sensing voltage according to a variation in a temperature of a memory cell, and "VTMP2" may indicate a reference sensing voltage discriminating a hot temperature and a cold temperature.

If a temperature of a memory cell goes to a hot temperature at a point of time t1, temperature sensing signal TSEN transitions to a high state as shown by a waveform TSEN. Thus, as shown by a waveform WRV, at a hot temperature, a voltage control unit 126 of FIG. 7 may generate a write voltage WRV having a level of a low write voltage VL.

At a cold temperature, the temperature sensing signal TSEN having a '0' state may be applied to the voltage control unit 126. Since a logic level of 1 is applied to a gate of a PMOS transistor PM2 of the voltage control unit 126 through an inverter INV1, the PMOS transistor PM2 is turned off. Meanwhile, since a logic level of 0 may be applied directly to a gate of a PMOS transistor PM1, the PMOS transistor PM1 is turned on.

Thus, at a cold temperature, the voltage control unit 126 of FIG. 7 may generate the write voltage WRV having a level of a high write voltage VH. The level of the high write voltage VH may be higher than that of the low write voltage VL as illustrated in FIG. 8.

If a temperature of a memory cell goes to a cold temperature at a point of time t1, the temperature sensing signal TSEN may transition to a low state as shown by the waveform TSEN. Thus, as shown by the waveform WRV, at a cold temperature, the voltage control unit 126 of FIG. 7 may generate the write voltage WRV having a level of the high write voltage VH.

A write driving unit 142 of FIG. 7 may receive the write voltage WRV as a write driving voltage at a write operation where data is stored at a memory cell 1. The write voltage WRV may be received as a low write voltage VL at a hot temperature and as a high write voltage VH at a cold temperature.

The write driving unit 142 may generate first and second driving control signals CTR1 and CTR2 in response to a write enable signal WE and data. The first and second driving control signals CTR1 and CTR2 may have a logic level value corresponding to input data in a period where the write enable signal WE is activated to a logic high. That is, if write data is '0', the first and second driving control signals CTR1 and CTR2 may go to a logic low. On the other hand, if write data is '1', the first and second driving control signals CTR1 and CTR2 may go to a logic high.

If the first and second driving control signals CTR1 and CTR2 go to a logic low, PMOS and NMOS transistors PM3 and NM2 may be turned on, so that a write current flows to a source line SL from a bit line BL of the memory cell 1. Thus, data '0' may be stored at the memory cell 1. In this case, a write current may flow by the low write voltage VL at a hot temperature and by the high write voltage VH at a cold temperature.

If the first and second driving control signals CTR1 and CTR2 go to a logic high, PMOS and NMOS transistors PM4 and NM1 may be turned on, so that a write current flows to the bit line BL of the memory cell 1 from the source line SL. Thus, data '1' may be stored at the memory cell 1. In this case, a write current may flow by the low write voltage VL at a hot temperature and by the high write voltage VH at a cold temperature.

In FIG. 7, there is described an example in which a level of a write voltage is varied according to a hot temperature and a cold temperature. However, an active time of a word line can be controlled according to the temperature of the memory device. In this case, a level of a write voltage may not be varied.

An operation where an active time of a word line is controlled according a temperature at a write operation will be more fully described with reference to FIGS. 9 to 11.

Figure 9:
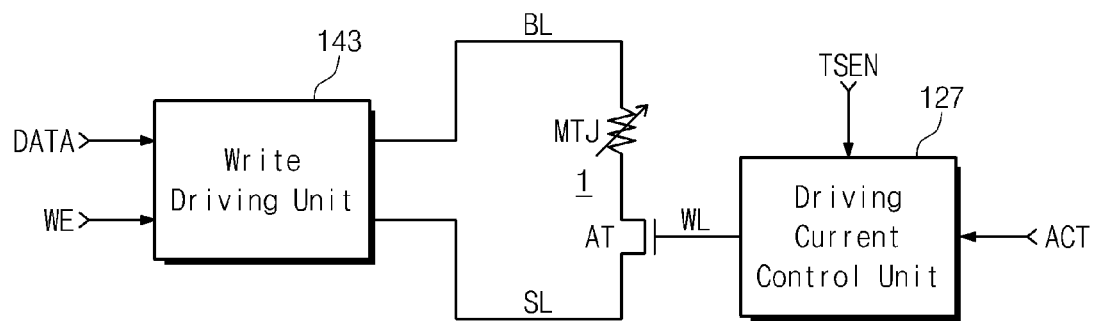
FIG. 9 is a circuit diagram illustrating a cell driving circuit according to another embodiment of the inventive concept.

FIG. 9 is a circuit diagram illustrating a cell driving circuit according to another embodiment of the inventive concept. FIG. 10 is a detailed circuit diagram of a driving current control unit of FIG. 9. FIG. 11 is a timing diagram illustrating signals associated with FIG. 10.

Referring to FIG. 9, a write driving unit 143 may be connected between a bit line BL and a source line SL. A driving current control unit 127 may be connected with a word line WL.

The write driving unit 143 may have structure as shown in FIG. 7 such that, as shown in FIG. 7, a voltage generator 124 may be connected to the write driving unit 143. Each of the one or more write voltages generated by the voltage generator 124 may have a substantially constant level. The write driving unit 143 may receive the write voltage WRV as a write driving voltage during a write operation where data is stored at a memory cell 1.

Figure 10:
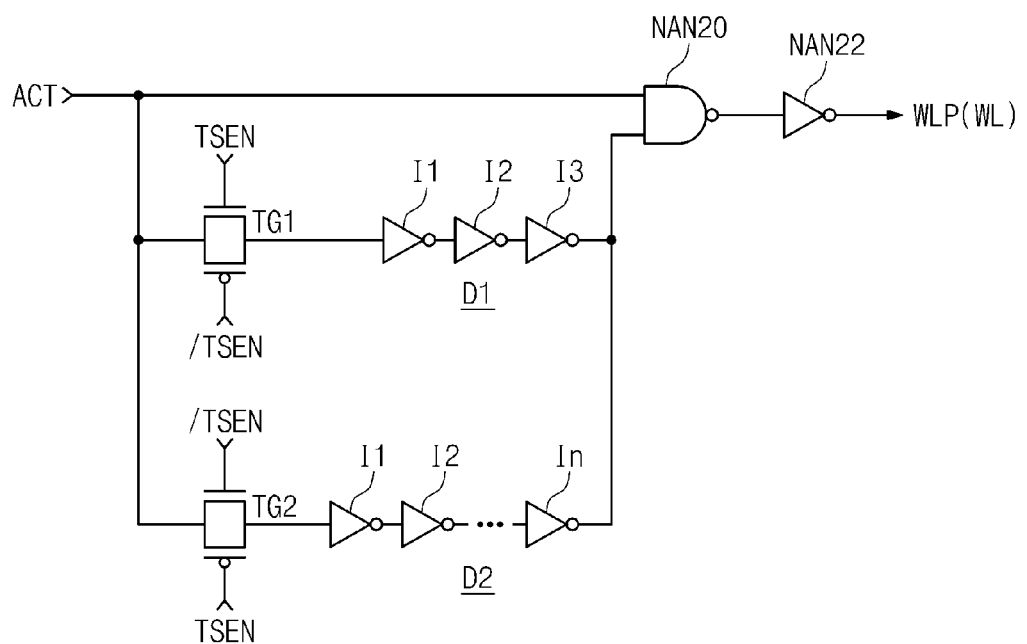
FIG. 10 is a detailed circuit diagram of a driving current control unit of FIG. 9.

The driving current control unit 127 may be configured as illustrated in FIG. 10.

Referring to FIG. 10, the driving current control unit 127 may include first and second transmission gates TG1 and TG2, first and second delays D1 and D2, a NAND gate NAN20, and an inverter NAN22.

At a write operation of FIG. 9, a write current applied to the memory cell 1 at a hot temperature may be equal to that at a cold temperature, but a turn-on time of an access transistor AT at a hot temperature may be different from that at a cold temperature. That is, a turn-on time of the access transistor AT may be relatively longer at the cold temperature. A turn-on time of the access transistor AT may be relatively shorter at the hot temperature.

Figure 11:
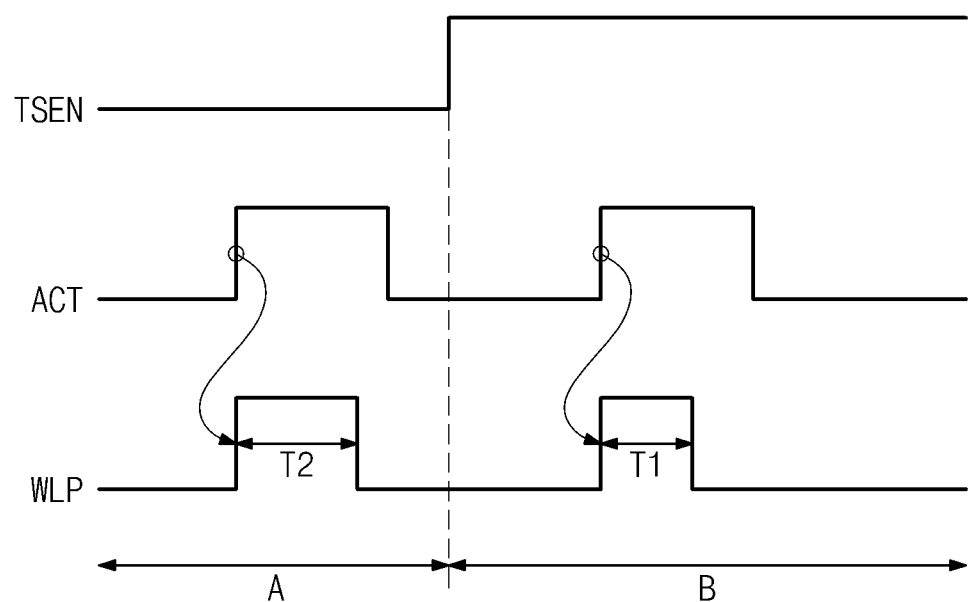
FIG. 11 is a timing diagram illustrating signals associated with FIG. 10.

Referring to FIG. 11, a waveform WLP may indicate a word line pulse applied to a gate of the access transistor AT. At a hot temperature, the word line pulse WLP may be at a high level for interval corresponding to a period of time T1. During the period of time T1, a write current may flow into the memory cell 1. At a cold temperature, the word line pulse WLP may be at a high level for an interval corresponding to a period of time T2. During the period of time T2, a write current may flow into the memory cell 1. In comparison with a hot temperature, a larger amount of current may flow into the memory cell 1 at a cold temperature. In FIG. 11, an interval A may indicate a cold temperature zone and an interval B may indicate a hot temperature zone. In FIG. 11, waveform ACT may indicate a word line active control signal. The word line active control signal may be generated by decoding a row address.

Returning to FIG. 10, if a word line WL of the memory cell 1 is selected by a decoding operation of a row decoder, the word line active control signal ACT may have a high level. At a hot temperature, the temperature sensing signal TSEN may be '1'. Thus, the first transmission gate TG1 may be turned on. The word line active control signal ACT may be transferred to the first delay D1 through the transmission gate TG1. The word line active control signal ACT may be delayed by a period of time T1 of FIG. 11 through the first delay D1. In this case, since the first delay D1 is formed of three inverters I1, I2, and I3, a phase of an output of the inverter I3 may be opposite to that of the word line active control signal ACT.

The NAND gate NAN20 may logically combine an output signal of the first delay D1 and the word line active control signal ACT, and an output signal of the NAND gate NAN20 may be inverted by the inverter NAN22. The inverter NAN22 may output the word line pulse WLP as an inverting result.

At a cold temperature, the temperature sensing signal TSEN may be '0'. Thus, the second transmission gate TG2 may be turned on. The word line active control signal ACT may be transferred to the second delay D2 through the transmission gate TG2. A delay time of the second delay D2 may be longer than that of the first delay D1. The word line active control signal ACT may be delayed by a period of time T2 of FIG. 11 through the second delay D2. In this case, since the second delay D2 is formed of an odd number of inverters I1 to In, a phase of an output of the inverter In may be opposite to that of the word line active control signal ACT.

The NAND gate NAN20 may logically combine an output signal of the second delay D2 and the word line active control signal ACT, and an output signal of the NAND gate NAN20 may be inverted by the inverter NAN22. The inverter NAN22 may output the word line pulse WLP as an inverting result.

As illustrated in FIG. 11, a width of the word line pulse WLP generated at a cold temperature may be narrower than that generated at a hot temperature.

In comparison with a cold temperature, less amount of write current may be applied to the memory cell 1 as compared to that applied at a hot temperature.

Thus, the number of write operations may be controlled to increase at a hot temperature, and the number of read operations may be controlled to increase at a cold temperature.

Figure 12:
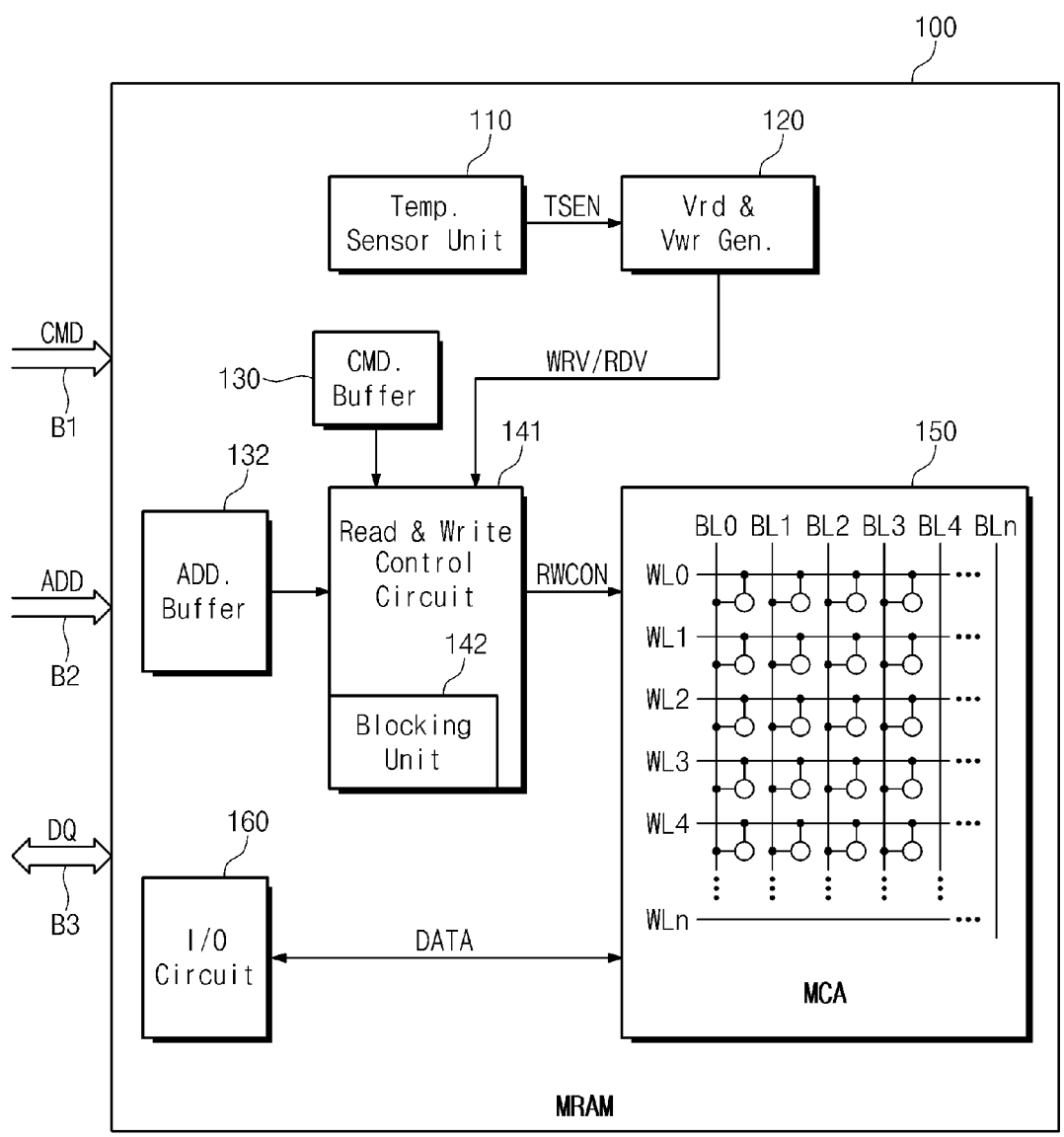
FIG. 12 is a block diagram schematically illustrating a semiconductor memory device according to still another embodiment of the inventive concept.

FIG. 12 is a block diagram schematically illustrating a semiconductor memory device according to still another embodiment of the inventive concept.

In FIG. 12, a semiconductor memory device 100 may control the number of read operations and the number of write operations differently according to a temperature without dependence on a memory controller or CPU.

Referring to FIG. 12, the semiconductor memory device 100 may include a temperature sensing unit 110, a read and write voltage generating unit 120, a command buffer 130, an address buffer 132, a read and write control circuit 141, an input/output circuit 160, and a memory cell array 150.

The memory cell array 150 may include memory cells arranged in a matrix of rows and columns and storing data having a polarity corresponding to a direction of current flowing between a bit line and a source line.

The temperature sensor unit 110 may sense a temperature of the memory cell array 150 to generate a temperature sensing signal.

To function as an operating voltage generating unit, at each mode of operation, the read and write voltage generator 120 may generate first and second write voltages WRV having different levels and first and second read voltages RDV having different levels according to the temperature sensing signal of the temperature sensing unit 110.

The read and write control circuit 141 may include a blocking unit 142 which blocks a write command or a read command according to the temperature sensing signal. The read and write control circuit 141 may limit an access number on a memory cell according to the temperature sensing signal at a read operation and a write operation.

The semiconductor memory device 100 of FIG. 12 may not output the temperature sensing signal TSEN to an external device. At a hot temperature, the blocking unit 142 of the read and write control circuit 141 may block a read command received. Thus, the number of read operations may be limited below an allowable maximum read operation number. In case of a hot temperature, the number of write operations may be controlled to be more than the number of read operations.

At a cold temperature, the blocking unit 142 of the read and write control circuit 141 may block a write command received. Thus, the number of write operations may be limited below an allowable maximum write operation number. In case of a cold temperature, the number of read operations may be controlled to be more than the number of write operations.

In the event that the semiconductor memory device 100 of FIG. 12 has a plurality of ports, the memory cell array 150 may include a shared memory area and dedicated memory areas.

For example, if the semiconductor memory device 100 has two ports, one port may be connected with a baseband processor for processing communication data, and the other may be connected with an application processor for processing multimedia data.

Figure 13:
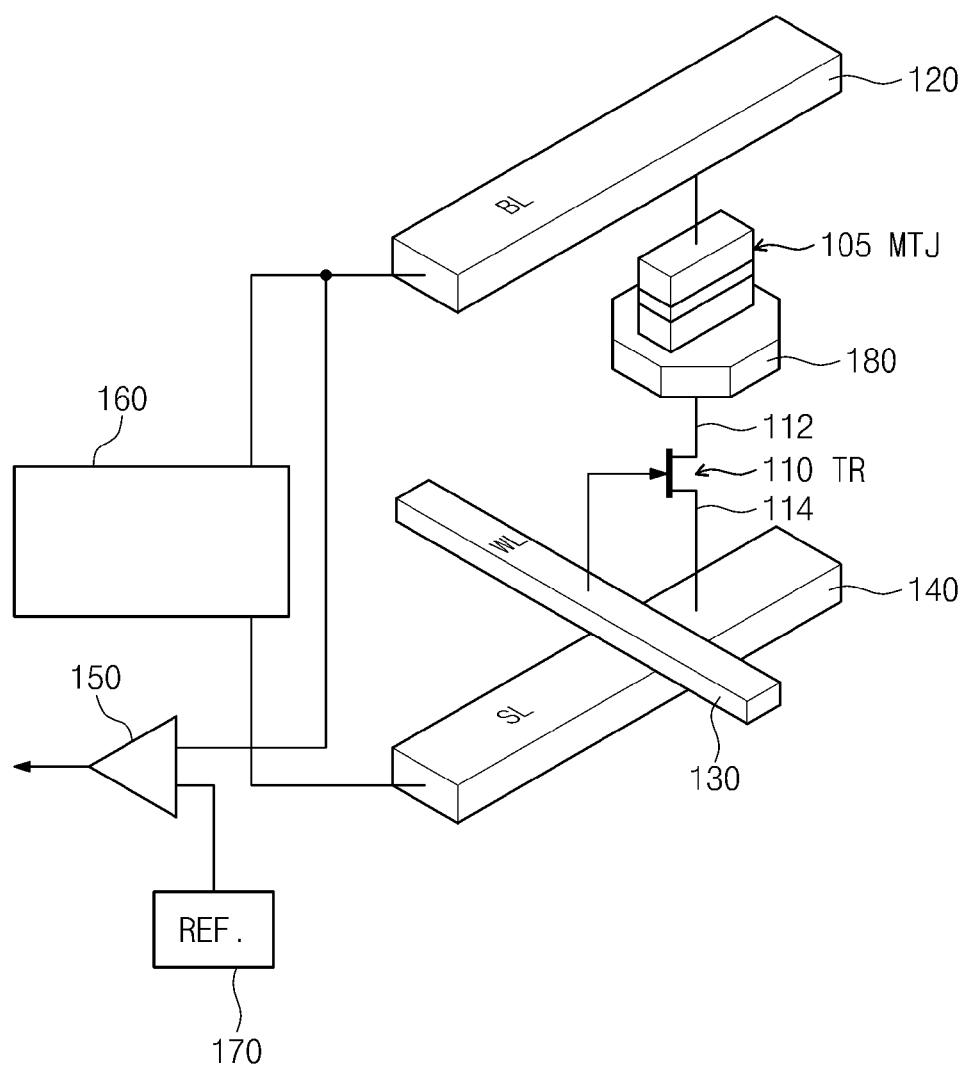
FIG. 13 is a diagram illustrating an operating principle of a memory cell applied to the inventive concept.

FIG. 13 is a diagram illustrating an operating principle of a memory cell applied to the inventive concept.

Referring to FIG. 13, an STT-MRAM cell may include a magnetic tunnel junction (MTJ) element 105, a transistor 110, a bit line 120, and a word line 130. For example, the MTJ element 105 may be formed of a pinned layer and a free layer separated by an insulation (tunnel barrier) layer and each having a magnetic field. A source line 140 may be connected with the transistor 110 through a line 114.

A sense amplifier 150 may compare a signal level of a bit line reference 170 and a signal level of a bit line 120 to amplify a comparison result (i.e., a difference between signal levels). A read/write circuit 160 may be connected between the bit line 120 and the source line 140.

The MTJ element 105 may be grown on a metal layer known as a bottom electrode (BE) plate 180, and the bottom electrode plate 180 may be connected to an upper portion 112 of the transistor 110 through a seed (not shown). Mechanical surface characteristics (e.g., flatness or roughness) of the bottom electrode plate 180 may influence the performance of the MTJ element 105. The bottom electrode plate 180 may be formed of stiff polished metal, for example, a titanium alloy having mechanical characteristics suitable to form it on the MTJ storage element 105 or metal similar thereto.

Figure 14:
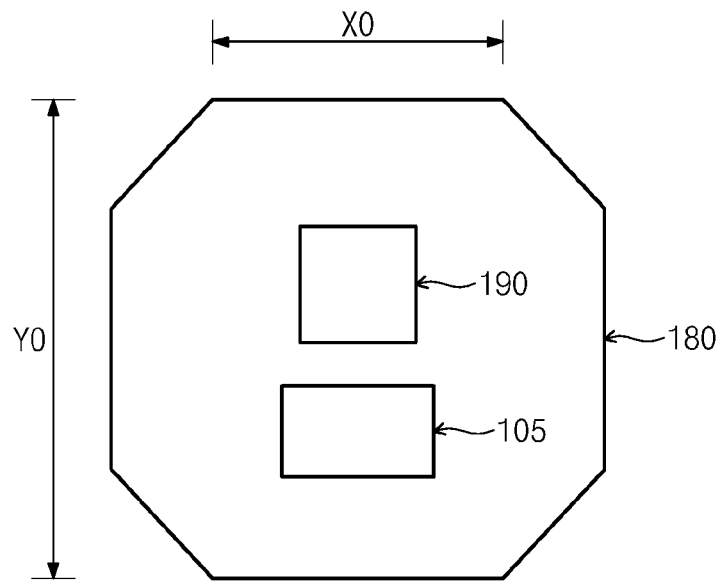
FIG. 14 is a top view of a memory cell of FIG. 13.
Figure 15:
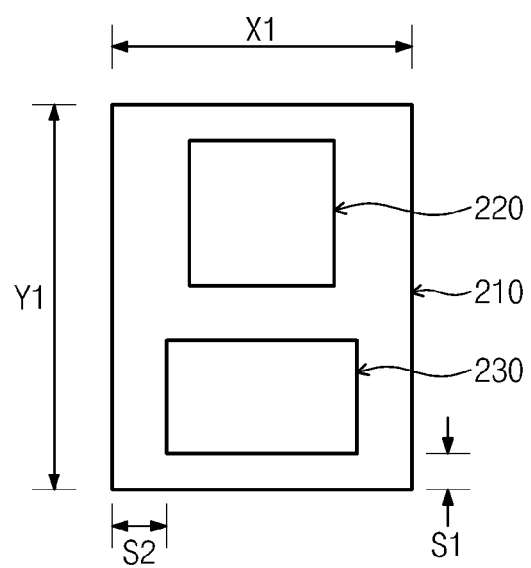
FIG. 15 is another top view of a memory cell of FIG. 13.

FIG. 14 is a top view of a memory cell of FIG. 13. FIG. 15 is another top view of a memory cell of FIG. 13.

Referring to FIG. 14, an STT-MRAM cell may include an MTJ element 105 formed on an octagonal bottom electrode plate 180. Also, the STT-MRAM cell may include a seed 190 connecting an upper portion of a transistor 110 and the bottom electrode plate 180.

As illustrated in FIG. 14, in typical asynchronous SST-MRAM cell array designs, corners of the bottom electrode plate 180 may be removed or etched to have an octagonal shape. This may assist space requirements between adjacent BE plates at an STT-MRAM cell array. The octagonal BE plate 180 may have a width X0 and a length Y0. In general STT-MRAM cells, a BE plate width X0, an active layer width, and a metal widths may be different as illustrated in FIG. 14.

Referring to FIG. 15, there is illustrated another STT-MRAM cell including a rectangular bottom electrode (BE) 210, a seed 220, and an MTJ element 230. Unlike an octagonal BE plate of an STT-MRAM cell of FIG. 14, the BE plate 210 may have a rectangular shape. The rectangular BE plate 210 may have a width X1 and a length Y1. The width X1 and/or the length Y1 of the STT-MRAM may be increased or decreased. "S1" and "S2" may indicate minimum space requirements between an edge of the MTJ storage element 230 and an edge of the BE plate 210.

As illustrated in FIG. 15, there is provided a rectangular (e.g., square) BE plate 210 more similar to a rectangular shape of the MTJ element 230. In this instance, efficiency of an area of the STT-MRAM cell may be improved. Since a width X1 of the rectangular BE plate of FIG. 15 is narrower than a width X0 of an octagonal BE plate of FIG. 14, an area of the STT-MRAM cell may be reduced. Also, since a length Y1 of the rectangular BE plate of FIG. 15 is narrower than a length Y0 of an octagonal BE plate of FIG. 14, an area of the STT-MRAM cell may be reduced.

An MRAM cell including a rectangular BE plate 210 and a storage element 230 on the rectangular BE plate 210 may be a bit cell of an STT-MRAM.

The MRAM may be a memory using such a characteristic that a spin is divided into up and down. That is, the MRAM may be a nonvolatile memory technique using magnetic characteristics. For example, the STT-MRAM may use electrons spin-polarized when the electrons penetrate a thin film (e.g., a spin filter). Also, the STT-MRAM may be divided into an STT-RAM, a spin momentum transfer RAM (SMT-RAM), and a spin transfer torque magnetisation switching RAM (Spin-RAM).

A typical MRAM using a magneto-resistance effect for changing resistance of a conductive material using a magnetic field may include a plurality of resistance memory cells formed by MTJ (Magnetic Tunnel Junction).

A tunneling current (or, tunneling resistance) flowing through the MTJ may vary according to a magnetization state of a ferromagnetic material. The ferromagnetic material may include a free layer and a pinned layer with the MTJ interposed therebetween. The tunneling resistance may be low when magnetization directions of the free and pinned layers are parallel and high when magnetization directions of the free and pinned layers are anti-parallel. In the event that an anti-ferromagnetic layer is added to the pinned layer, a magnetization direction of the pinned layer may be fixed and the tunneling resistance may vary according to a magnetization direction of the free layer. Herein, the magnetization direction of the free layer may be switched using a magnetic field formed by currents flowing along a bit line and a word line. In the above-described method, as a resistive memory device is highly integrated, coercivity of the free layer may increase. This may cause unwanted switching of the free layer. Thus, there may be a growing interest in a magnetic memory device using a spin transfer torque manner or a magnetic memory device using a toggle switching writing manner.

The magnetic memory device using a spin transfer torque manner may switch a free layer in a required direction using a spin transfer of electron by providing a current in a direction where a spin is polarized. This may mean that the amount of current required is relatively reduced according to scale-down of a cell size. Thus, it is possible to integrate the resistive memory device highly.

A word line and a bit line may be disposed to be inclined by a 40° direction at an intersection, and MTJ may include a second magnetic area, a tunneling barrier, and a first magnetic area which are sequentially stacked. Herein, the first and second magnetic areas may include an SAF (Synthetic Anti-Ferromagnetic) structure which includes an upper ferromagnetic layer, a lower ferromagnetic layer, and a diamagnetic coupling spacer layer inserted between the upper ferromagnetic layer and the lower ferromagnetic layer.

Figure 16:
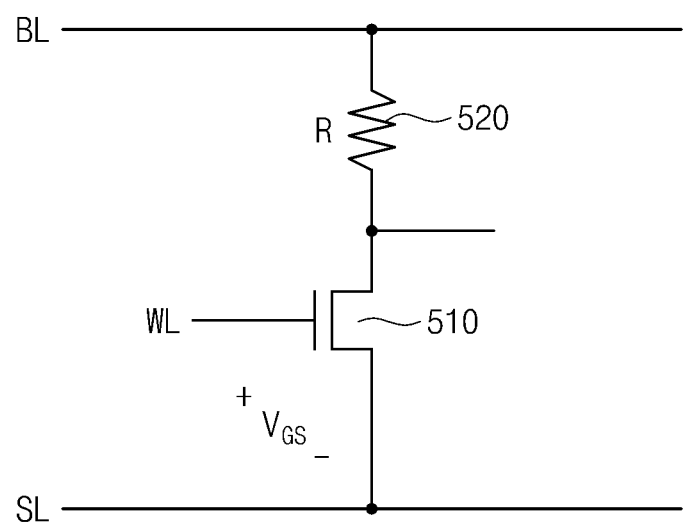
FIG. 16 is an equivalent circuit diagram of a memory cell of FIG. 13.

FIG. 16 is an equivalent circuit diagram of a memory cell of FIG. 13.

Referring to FIG. 16, an STT-MRAM cell may include a word line WL connected with an access transistor 510. A storage element (e.g., MTJ) 520 may be expressed by a resistor. The access transistor 510 and the storage element 520 may be disposed between a bit line BL and a source line SL. During a writing operation, a state "0" may be stored under the condition that WL=H, BL=H, and SL=L, and a state "1" may be stored under the condition that WL=H, BL=L, and SL=L. In example embodiments, "H" may be a high voltage/logic level, and "L" may be a low voltage/logic level. Voltage levels may be supply voltage levels (e.g., Vdd and 0V) or higher or lower than the supply voltage levels. Arrangement and state conditions may be exemplary. However, the inventive concept is not limited thereto.

Figure 17:
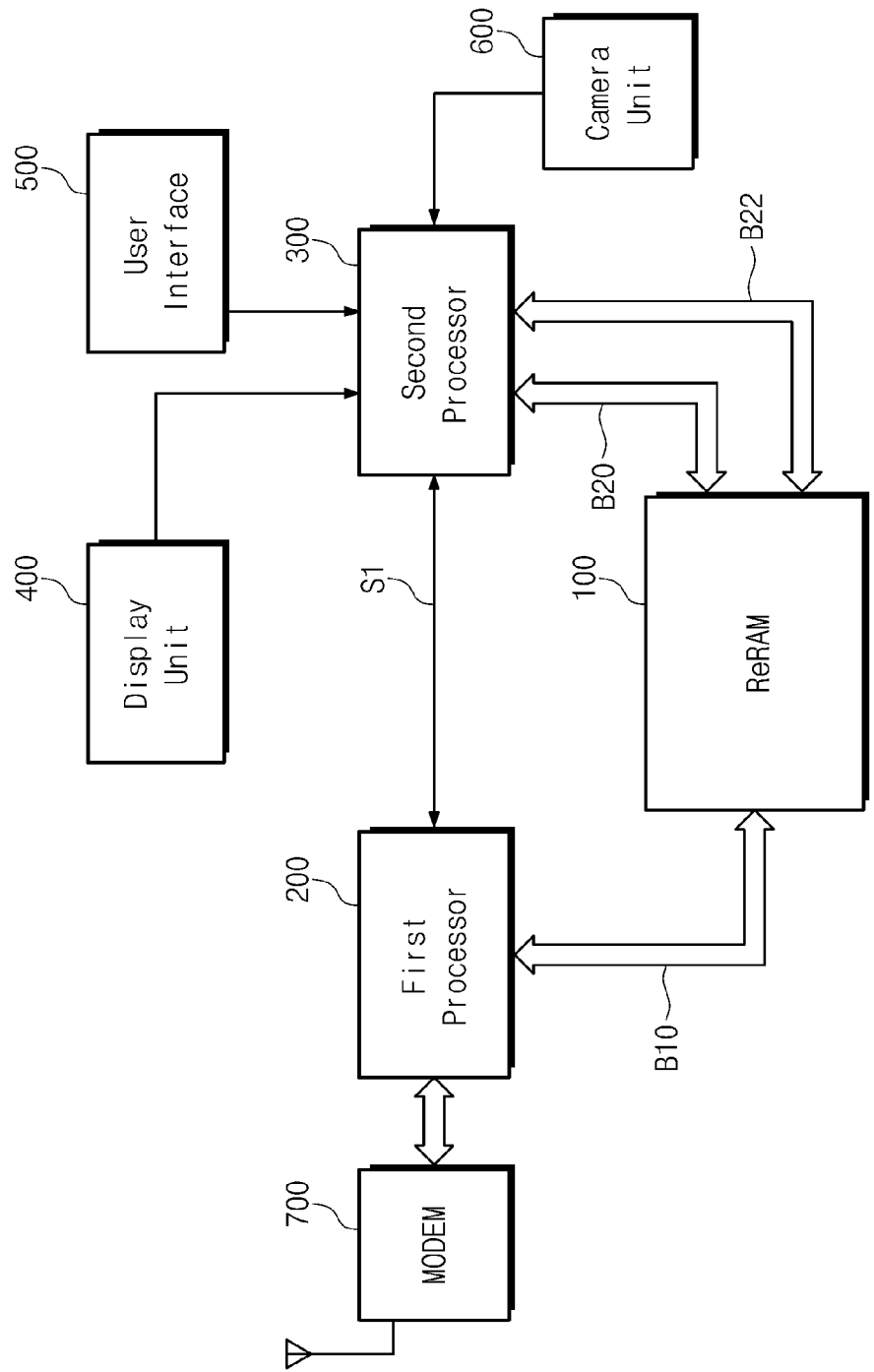
FIG. 17 is a block diagram schematically illustrating an application of the inventive concept applied to a mobile device.

FIG. 17 is a block diagram schematically illustrating an application of the inventive concept applied to a mobile device.

Referring to FIG. 17, a mobile device may include a multi-port MRAM 100, a first processor 200, a second processor 300, a display unit 400, a user interface 500, a camera unit 600, and a modem 700.

The multi-port MRAM 100, the first processor 200 and the second processor 300 may be connected. Thus, one multi-port MRAM 100 may be a memory device which may be used in place of a storage memory and two DRAMs.

The multi-port MRAM 100 of FIG. 17 may include three ports and different interfaces to perform roles of a DRAM and a flash memory. Since the multi-port MRAM 100 performs a write operation and a read operation differently according to a temperature, read disturbance may be prevented or minimized. The performance of the mobile device may be improved according to an operation of the multi-port MRAM 100. Also, since a memory device is used as two DRAMs and a flash memory, a system size may be scaled down, so that a cost necessary to implement the system is reduced. In addition, since it is used without changing interconnection between existing processors, the compatibility may be bettered.

A first port of the multi-port MRAM 100 may be connected to the first processor 200 being a baseband processor through a first bus B10, and a second port thereof may be connected to a second processor 300 being an application processor through a second bus B20. Also, a third port of the multi-port MRAM 100 may be connected to the second processor 300 through a third bus B22.

An interface of the first bus B10 may be a DRAM interface, and the first port may receive first packet data DQ1/ADDR1/CMD1 generated from the first processor 200 to transfer it to an internal circuit block of the multi-port MRAM 100. Also, the first port may provide first data of the multi-port MRAM 100 to the first processor 200. In this case, the first data may be parallel data.

An interface of the third bus B22 may be a DRAM interface, and the third port may receive third packet data DQ3/ADDR3/CMD3 generated from the second processor 300 to transfer it to an internal circuit block of the multi-port MRAM 100. Also, the third port may provide third data of the multi-port MRAM 100 to the second processor 300. In this case, the first data may be serial data or parallel data. A clock generator (not shown) may generate a first internal clock signal ICLK1 and a third internal clock signal ICLK3 based on an external clock signal CLK. In this case, a frequency of the first internal clock signal ICLK1 may be different from that of the third internal clock signal ICLK3.

In some cases, the first and second processors 200 and 300 and the MRAM 100 may be integrated to a chip or packaged. In this case, the MRAM 100 may be embedded in the mobile device.

In the event that the mobile device is a handheld communications device, the first processor 200 may be connected with the modem 700 which transmits and receives communications data and modulates and demodulates data.

A NOR or NAND flash memory may be additionally connected to the first processor 200 or the second processor 300 to store mass information.

The display unit 400 may have a liquid crystal having a backlight, a liquid crystal having an LED light source, or a touch screen (e.g., OLED). The display unit 400 may be an output device for displaying images (e.g., characters, numbers, pictures, etc.) in color.

There is described an example in which the mobile device is a mobile communications device. In some cases, the mobile device may be used as a smart card by adding or removing components.

The mobile device may be connected with an external communications device through a separate interface. The communications device may be a DVD player, a computer, a set top box (STB), a game machine, a digital camcorder, or the like.

The camera unit 600 may include a camera image processor (CIS), and may be connected with the second processor 300.

Although not shown in FIG. 10, the mobile device may further include an application chipset, a camera image processor (CIS), a mobile DRAM, and so on.

An MRAM chip or a flash memory chip may be mounted independently or using various packages. For example, a chip may be packed by a package such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), or the like.

In FIG. 17, there is illustrated an example in which an MRAM is installed at the mobile device. However, a variety of nonvolatile memories may be used instead of the MRAM.

The nonvolatile memory may store various types of data information such as texts, graphics, software codes, and so on.

The nonvolatile memory device may be EEPROM (Electrically Erasable Programmable Read-Only Memory), STT-MRAM (Spin-Transfer Torque MRAM), CBRAM (Conductive bridging RAM), FeRAM (Ferroelectric RAM), PRAM (Phase change RAM) called OUM (Ovonic Unified Memory), RRAM or ReRAM (Resistive RAM), nanotube RRAM, PoRAM (Polymer RAM), NFGM (Nano Floating Gate Memory), holographic memory, molecular electronics memory device), or insulator resistance change memory.

A semiconductor memory device 100 of FIG. 1 may be used as a memory which replaces a DRAM and a small-capacity flash memory in a cellular phone, a tablet PC, or a notebook computer.

Figure 18:
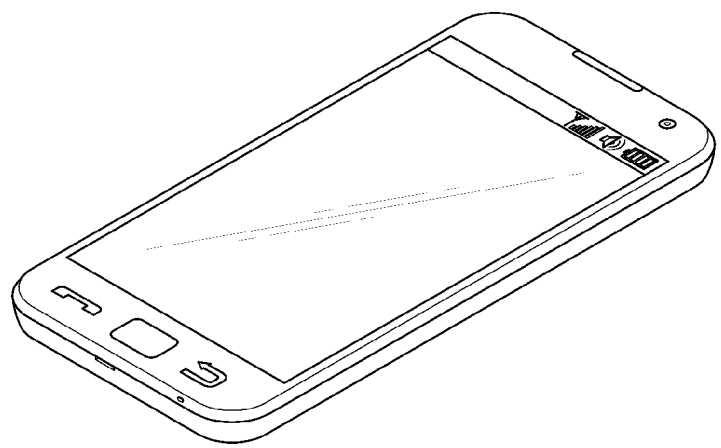
FIG. 18 is a diagram illustrating an application of the inventive concept applied to a cellular phone.

FIG. 18 is a diagram illustrating an application of the inventive concept applied to a cellular phone.

Referring to FIG. 18, a cellular phone 2000 may include a semiconductor memory device 100 of FIG. 1, so that a DRAM and a small-capacity flash memory are removed. In case of the cellular phone 2000, since the semiconductor memory device 100 performs a write operation and a read operation differently according to a temperature, read disturbance may be prevented or minimized. This may mean that the reliability of the cellular phone is improved. Also, since a memory device is used as two DRAMs and a flash memory, a phone size may be scaled down, so that a cost necessary to implement the cellular phone is reduced.

Figure 19:
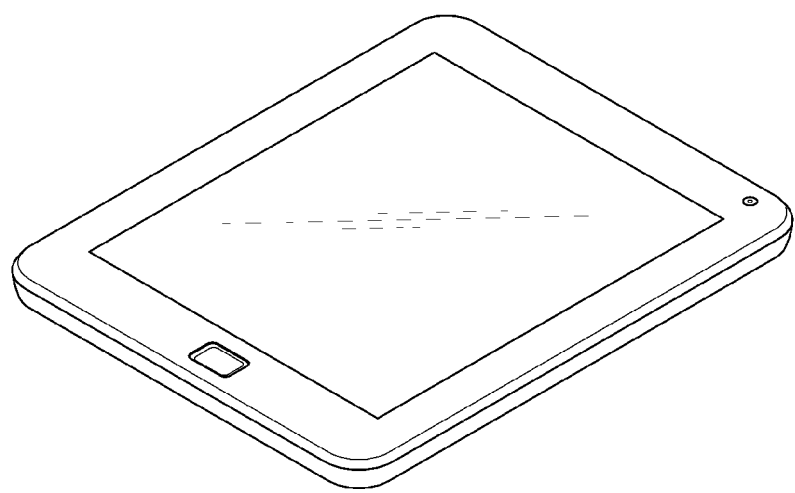
FIG. 19 is a diagram illustrating an application of the inventive concept applied to a tablet PC.

FIG. 19 is a diagram illustrating an application of the inventive concept applied to a tablet PC.

Referring to FIG. 19, a tablet PC 3000 may include a semiconductor memory device 100 of FIG. 1, so that a DRAM and a small-capacity flash memory are removed. Thus, in case of the tablet PC 3000, since the semiconductor memory device 100 performs a write operation and a read operation differently according to a temperature, read disturbance may be prevented or minimized. This may mean that the performance of the tablet PC 3000 is improved. Also, since a memory device is used as two DRAMs and a flash memory, a PC size may be scaled down, so that a cost necessary to implement the tablet PC is reduced.

Figure 20:
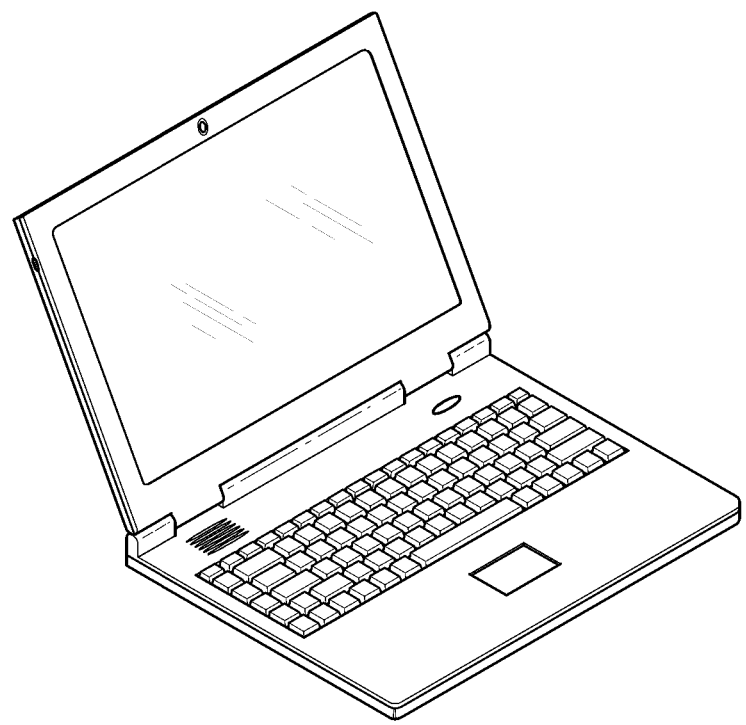
FIG. 20 is a diagram illustrating an application of the inventive concept applied to a notebook computer.

FIG. 20 is a diagram illustrating an application of the inventive concept applied to a notebook computer.

Referring to FIG. 20, a notebook computer 4000 may include a semiconductor memory device 100 of FIG. 1, so that a DRAM and a small-capacity flash memory are removed. Thus, in case of the notebook computer 4000, since the semiconductor memory device 100 performs a write operation and a read operation differently according to a temperature, read disturbance may be prevented or minimized. To discriminate access operations dependent on a temperature may improve the reliability of the notebook computer. Also, since a memory device is used as two DRAMs and a flash memory, a size of the notebook computer may be scaled down, so that a cost necessary to implement the notebook computer is reduced.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative. For example, various changes and modifications on a manner of discriminating write and read operations of a semiconductor memory device according to a temperature sensing signal of a temperature sensing unit may be made without departing from the spirit and scope of the present invention.

What is claimed is:

1. A semiconductor memory system comprising:
   a semiconductor memory device including
      a memory cell array of magnetic memory cells arranged in a matrix form of rows and columns, and
      a temperature sensing unit configured to generate a temperature sensing signal by sensing a temperature of the memory cell array; and
   a memory controller configured to receive the temperature sensing signal generated by the temperature sensing unit and to control at least one of write operations and read operations of the semiconductor memory device in response to the temperature sensing signal of the temperature sensing unit,
wherein the memory controller is configured to perform at least one of the following operations:
to control the number of write operations to be more than the number of read operations when the temperature sensing signal indicates a temperature higher than a reference temperature,
to control an operating frequency of the write operations to be higher than an operating frequency of the read operations when the temperature sensing signal indicates a temperature higher than a reference temperature,
to issue a number of commands for write operations to be more than a number of commands for read operations when the temperature sensing signal indicates a temperature higher than a reference temperature.

2. A semiconductor memory system comprising:
a semiconductor memory device including
a memory cell array of magnetic memory cells arranged in a matrix form of rows and columns, and
a temperature sensing unit configured to generate a temperature sensing signal by sensing a temperature of the memory cell array; and
a memory controller configured to receive the temperature sensing signal generated by the temperature sensing unit and to control at least one of write operations and read operations of the semiconductor memory device in response to the temperature sensing signal of the temperature sensing unit,
wherein the memory controller is configured to perform at least one of the following operations:
to control a number of read operations to be more than a number of write operations when the temperature sensing signal indicates a temperature lower than a reference temperature,
to control an operating frequency of the read operations to be higher than an operating frequency of the write operations when the temperature sensing signal indicates a temperature lower than a reference temperature, and
to issue a number of commands for read operations to be more than a number of commands for write operations when the temperature sensing signal indicates a temperature lower than a reference temperature.

3. The semiconductor memory system of claim 1, wherein the memory controller comprises a dedicated input terminal for receiving the temperature sensing signal.

4. The semiconductor memory system of claim 1, wherein each memory cell is a spin transfer torque magneto-resistive random access memory (STT-MRAM) cell.

5. A semiconductor memory device comprising:
a memory cell array including magnetic memory cells arranged in a matrix form of rows and columns;
a temperature sensing unit configured to generate a temperature sensing signal by sensing a temperature of the memory cell array; and
a control circuit configured to control at least one of write operations and read operations in response to the temperature sensing signal of the temperature sensing unit,
wherein the control circuit is configured to perform at least one of the following operations:
to control a number of write operations to be higher than a number of read operations when the temperature sensing signal indicates a temperature higher than a reference temperature, and
to control an operating frequency of the write operations to be higher than an operating frequency of the read operations when the temperature sensing signal indicates a temperature higher than a reference temperature.

6. The semiconductor memory device of claim 5, wherein the control circuit is configured to control a number of read operations to be more than a number of write operations when the temperature sensing signal indicates a temperature lower than a reference temperature.

7. The semiconductor memory device of claim 5, wherein the control circuit is configured to control an operating frequency of the read operations to be higher than an operating frequency of the write operations.

8. A semiconductor memory device comprising:
a memory cell array including magnetic memory cells arranged in a matrix form of rows and columns;
a temperature sensing unit configured to generate a temperature sensing signal by sensing a temperature of the memory cell array;
a control circuit configured to control at least one of write operations and read operations in response to the temperature sensing signal of the temperature sensing unit; and
an input/output circuit configured to transfer the temperature sensing signal to a memory controller;
wherein the control circuit is configured to control an operating frequency of the read operations to be higher than an operating frequency of the write operations.

9. A semiconductor memory device comprising:
a memory cell array including magnetic memory cells arranged in a matrix form of rows and columns;
a temperature sensing unit configured to generate a temperature sensing signal by sensing a temperature of the memory cell array;
an operating voltage generating unit configured to generate first and second write voltages having different levels according to the temperature sensing signal of the temperature sensing unit and first and second read voltages having different levels according to the temperature sensing signal of the temperature sensing unit according to a mode of operation; and
a control circuit configured to adjust a number of accesses of the memory cell array in response to the temperature sensing signal, each access being one of a read operation and a write operation.

10. The semiconductor memory device of claim 9,
wherein the first write voltage is lower than the second write voltage, and
wherein the operating voltage generating unit is configured to generate the first write voltage when the temperature sensing signal indicates a temperature higher than a reference temperature.

11. The semiconductor memory device of claim 9,
wherein the first read voltage is lower than the second read voltage, and
wherein the operating voltage generating unit is configured to generate the first read voltage when the temperature sensing signal indicates a temperature higher than a reference temperature.

12. An operation controlling method of a semiconductor nonvolatile memory device comprising:
generating a temperature sensing signal by sensing a temperature of at least a portion of the nonvolatile memory device;

controlling the number of write operations to be more than the number of read operations when the temperature sensing signal is at a first state; and controlling the number of read operations to be more than the number of write operations when the temperature sensing signal is at a second state.

13. The operation controlling method of claim 12, wherein the number of read operations is controlled to be below a predetermined maximum number at the first state, and the number of write operations is controlled to be below a predetermined maximum number at the second state.

14. A memory controller comprising:
an input configured to receive a temperature sensing signal from a memory device indicating a temperature of the memory device;
a control unit configured to issue a plurality of read commands and write commands to the memory device, the control unit being configured to adjust a number of at least one of read commands and write commands in response to the received temperature sensing signal.

15. The memory controller of claim 14, wherein the controller is configured to adjust a ratio of a number of read commands issued to the memory device to the number of write commands to the memory device in response to the received temperature sensing signal.

16. The memory controller of claim 15, wherein the controller is configured to increase the ratio of read commands to write commands when the temperature sensing signal is below a predetermined threshold.

17. The memory controller of claim 15, wherein the controller is configured to decrease the ratio of read commands to write commands when the temperature sensing signal is above a predetermined threshold.

18. The memory controller of claim 14, wherein the controller is configured to decrease a frequency of write commands when the temperature sensing signal is below a predetermined threshold.

19. The memory controller of claim 14, wherein the controller is configured to decrease a frequency of read commands when the temperature sensing signal is above a predetermined threshold.

20. The memory controller of claim 14, wherein the input configured to receive the temperature sensing signal is dedicated to receive the temperature sensing signal.

* * * * *